(12) United States Patent
Kyung et al.

(10) Patent No.: US 7,502,987 B2
(45) Date of Patent: Mar. 10, 2009

(54) APPARATUS AND METHOD FOR ENCODING AND DECODING BLOCK LOW DENSITY PARITY CHECK CODES WITH A VARIABLE CODING RATE

(75) Inventors: Gyu-Bum Kyung, Suwon-si (KR);
Hyun-Koo Yang, Pohang-si (KR);
Se-Ho Myung, Pohang-si (KR);
Hong-Sil Jeong, Suwon-si (KR);
Kyeong-Cheol Yang, Pohang-si (KR);
Dong-Seek Park, Yongin-si (KR);
Jae-Yoel Kim, Gunpo-si (KR)

(73) Assignees: Samsung Electronics Co., Ltd (KR);
Postech Academy Industry Foundation (KR)

( * ) Notice: Subject to any disclaimer, the term of this patent is extended or adjusted under 35 U.S.C. 154(b) by 531 days.

(21) Appl. No.: 11/129,183

(22) Filed: May 12, 2005

(65) Prior Publication Data

US 2005/0283708 A1    Dec. 22, 2005

(30) Foreign Application Priority Data

| May 12, 2004 | (KR) | ............. 10-2004-0033329 |
| May 19, 2004 | (KR) | ............. 10-2004-0035750 |
| Jun. 1, 2004 | (KR) | ............. 10-2004-0039661 |
| Aug. 16, 2004 | (KR) | ............. 10-2004-0066574 |

(51) Int. Cl.
*H03M 13/00* (2006.01)
*H03M 13/03* (2006.01)

(52) U.S. Cl. ............. 714/781; 714/758; 714/794

(58) Field of Classification Search .......... 714/758, 714/794, 781
See application file for complete search history.

(56) References Cited

U.S. PATENT DOCUMENTS

| 5,268,909 | A  |   | 12/1993 | Loebig |
| 5,515,506 | A  |   | 5/1996  | Dixon |
| 6,718,508 | B2 | * | 4/2004  | Lodge et al. ............. 714/780 |
| 6,895,547 | B2 | * | 5/2005  | Eleftheriou et al. ........ 714/801 |
| 7,000,174 | B2 | * | 2/2006  | Mantha et al. ............. 714/790 |
| 7,089,479 | B2 | * | 8/2006  | Matsumoto ................. 714/758 |
| 7,178,082 | B2 | * | 2/2007  | Yu et al. ..................... 714/752 |

(Continued)

FOREIGN PATENT DOCUMENTS

KR    1020040004162    1/2004

(Continued)

OTHER PUBLICATIONS

Stephen B. Wicker, Error Control Systems for Digital Communication and Storage, Prentice-Hall, 1995, pp. 94-97.*

(Continued)

*Primary Examiner*—Joseph D Torres
(74) *Attorney, Agent, or Firm*—The Farrell Law Firm, PC

(57) ABSTRACT

An apparatus and method for coding a block Low Density Parity Check (LDPC) code having a variable coding rate. The apparatus receives an information word and encodes the information word into a block LDPC code based on one of a first parity check matrix and a second parity check matrix, depending on a coding rate to be applied when generating the information word into the block LDPC code.

48 Claims, 23 Drawing Sheets

U.S. PATENT DOCUMENTS

| | | | |
|---|---|---|---|
| 7,191,378 B2 * | 3/2007 | Eroz et al. | 714/758 |
| 7,222,284 B2 * | 5/2007 | Stolpman | 714/774 |
| 7,254,769 B2 * | 8/2007 | Kim et al. | 714/774 |
| 7,260,763 B2 * | 8/2007 | Sukhobok et al. | 714/758 |
| 7,272,770 B2 * | 9/2007 | Matsumoto | 714/752 |
| 7,313,752 B2 * | 12/2007 | Kyung et al. | 714/801 |
| 2003/0014718 A1 | 1/2003 | De Souza et al. | |
| 2003/0033570 A1 | 2/2003 | Khannanov et al. | |
| 2003/0033575 A1 | 2/2003 | Richardson et al. | |
| 2003/0126551 A1 | 7/2003 | Mantha et al. | |
| 2004/0047433 A1 | 3/2004 | Mogre et al. | |
| 2004/0123229 A1 | 6/2004 | Kim et al. | |
| 2005/0160351 A1 * | 7/2005 | Ko et al. | 714/801 |
| 2005/0204273 A1 * | 9/2005 | Jeong et al. | 714/801 |
| 2005/0235195 A1 * | 10/2005 | Choi et al. | 714/800 |
| 2005/0283708 A1 * | 12/2005 | Kyung et al. | 714/758 |
| 2008/0028273 A1 * | 1/2008 | Jeong et al. | 714/752 |

FOREIGN PATENT DOCUMENTS

| | | |
|---|---|---|
| KR | 2004-0030089 | 4/2004 |
| KR | 1020040033554 | 4/2004 |
| RU | 2 007 042 | 1/1994 |
| RU | 2 190 296 | 8/1999 |
| WO | WO 00/55974 | 9/2000 |
| WO | WO 01/97387 | 12/2001 |
| WO | WO 2004/019268 | 3/2004 |

OTHER PUBLICATIONS

Echard et al., "The Extended Irregular π-Rotation LDPC Codes", May 2003.

Yang et al., "Performance of Efficiently Encodable Low-Density Parity-Check Codes in Noise Bursts on the EPR4 Channel", Mar. 1, 2004.

Ten Brink et al., "Design of Low-Density Parity-Check Codes for Modulation and Detection", Apr. 2004.

Yazdani et al., "Irregular Rate-Compatible LDPC Codes for Capacity-Approaching Hybrid-ARQ Schemes", May 2, 2004.

Ha et al., "Optimal Puncturing of Irregular Low-Density Parity Check-Codes", May 11, 2003.

Richardson et al., "Efficient Encoding of Low-Density Parity-Check Codes", Feb. 2001.

Li et al., "Rate-Compatible Low Density Parity Check Codes for Capacity-Approaching ARQ Schemes in Packet Data Communications", Nov. 18, 2002.

Wilson, "Digital Modulation and Coding". 1996.

* cited by examiner

| $P^a{}_{11}$ | $P^a{}_{12}$ | $P^a{}_{13}$ | $P^a{}_{14}$ | ... | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | ... | $P^a{}_{2(q-1)}$ | $P^a{}_{2q}$ |
| $P^a{}_{31}$ | $P^a{}_{32}$ | $P^a{}_{33}$ | $P^a{}_{34}$ | ... | $P^a{}_{3(q-1)}$ | $P^a{}_{3q}$ |
| ⋮ | ⋮ | ⋮ | ⋮ | ... | ⋮ | ⋮ |
| $P^a{}_{p1}$ | $P^a{}_{p2}$ | $P^a{}_{p3}$ | $P^a{}_{p4}$ | ... | $P^a{}_{p(q-1)}$ | $P^a{}_{pq}$ |

FIG.4
(PRIOR ART)

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}$$

APPARATUS AND METHOD FOR ENCODING AND DECODING BLOCK LOW DENSITY PARITY CHECK CODES WITH A VARIABLE CODING RATE

PRIORITY

This application claims priority under 35 U.S.C. § 119 to an application entitled "Apparatus and Method for Encoding/Decoding Block Low Density Parity Check Code with Variable Coding Rate" filed in the Korean Intellectual Property Office on May 12, 2004 and assigned Serial No. 2004-33329, an application entitled "Apparatus and Method for Encoding/Decoding Block Low Density Parity Check Code with Variable Coding Rate" filed in the Korean Intellectual Property Office on May 19, 2004 and assigned Serial No. 2004-35750, an application entitled "Apparatus and Method for Encoding/Decoding Block Low Density Parity Check Code with Variable Coding Rate" filed in the Korean Intellectual Property Office on Jun. 1, 2004 and assigned Serial No. 2004-39661, and an application entitled "Apparatus and Method for Encoding/Decoding Block Low Density Parity Check Code with Variable Coding Rate" filed in the Korean Intellectual Property Office on Aug. 16, 2004 and assigned Serial No. 2004-66574, the contents of all of which are incorporated herein by reference.

BACKGROUND OF THE INVENTION

1. Field of the Invention

The present invention relates generally to a mobile communication system, and in particular, to an apparatus and method for coding and decoding block Low Density Parity Check (LDPC) codes having a variable coding rate.

2. Description of the Related Art

With the rapid development of mobile communication systems, it is necessary to develop technology capable of transmitting bulk data approximating the capacity of a wire network even in a wireless environment. To meet the increasing demand for a high-speed, high-capacity communication system capable of processing and transmitting various data such as image and radio data beyond the voice-oriented service, it is essential to increase the transmission efficiency of a system by using an appropriate channel coding scheme to thereby improve the overall system performance. However, the mobile communication system, because of its characteristics, inevitably generates errors during data transmission due to noise, interference and fading according to channel conditions. The generation of errors causes a loss of a great amount of information data.

In order to prevent the loss of the information data due to the generation of errors, various error control schemes are currently in use and are based in part on channel characteristics to thereby improve the reliability of the mobile communication system. The most typical error control scheme uses error correction codes.

FIG. 1 is a diagram illustrating a structure of a transmitter/receiver in a conventional mobile communication system. Referring to FIG. 1, a transmitter 100 includes an encoder 111, a modulator 113 and a radio frequency (RF) processor 115, and a receiver 150 includes an RF processor 151, a demodulator 153 and a decoder 155.

In the transmitter 100, transmission information data 'u', if generated, is delivered to the encoder 111. The encoder 111 generates a coded symbol 'c' by coding the information data 'u' with a predetermined coding scheme, and outputs the coded symbol 'c' to the modulator 113. The modulator 113 generates a modulated symbol 's' by modulating the coded symbol 'c' with a predetermined modulation scheme, and outputs the modulated symbol 's' to the RF processor 115. The RF processor 115 RF-processes the modulated symbol 's' output from the modulator 113, and transmits the RF-processed signal over the air via an antenna ANT.

The signal transmitted over the air by the transmitter 100 in this way is received at the receiver 150 via its antenna ANT, and the signal received via the antenna is delivered to the RF processor 151. The RF processor 151 RF-processes the received signal, and outputs the RF-processed signal 'r' to the demodulator 153. The demodulator 153 demodulates the RF-processed signal 'r' output from the RF processor 151 using a demodulation scheme corresponding to the modulation scheme applied in the modulator 113, and outputs the demodulated signal 'x' to the decoder 155. The decoder 155 decodes the demodulated signal 'x' output from the demodulator 153 using a decoding scheme corresponding to the coding scheme applied in the encoder 111, and outputs the decoded signal 'û' as finally decoded information data.

In order for the receiver 150 to decode without errors the information data 'u' transmitted by the transmitter 100, there is a need for a high-performance encoder and decoder. Particularly, because a radio channel environment should be taken into consideration because of the characteristics of a mobile communication system, errors that can be generated due to the radio channel environment should be considered more seriously.

The most typical error correction codes include turbo codes and Low Density Parity Check (LDPC) codes.

It is well known that the turbo code is superior in performance gain to a convolutional code that is conventionally used for error correction, during high-speed data transmission. The turbo code is advantageous in that it can efficiently correct an error caused by noise generated in a transmission channel, thereby increasing the reliability of the data transmission. The LDPC code can be decoded using an iterative decoding algorithm base on a sum-product algorithm in a factor graph. Because a decoder for the LDPC code uses the sum-product algorithm-based iterative decoding algorithm, it is less complex than a decoder for the turbo code. In addition, the decoder for the LDPC code is easy to implement with a parallel processing decoder, compared with the decoder for the turbo code.

Shannon's channel coding theorem illustrates that reliable communication is possible only at a data rate not exceeding a channel capacity. However, Shannon's channel coding theorem has proposed no detailed channel coding/decoding method for supporting a data rate up to the maximum channel capacity limit. Generally, although a random code having a very large block size exhibits a performance approximating a channel capacity limit of Shannon's channel coding theorem, when a MAP (Maximum A Posteriori) or ML (Maximum Likelihood) decoding method is used, it is actually impossible to implement the decoding method because of its heavy calculation load.

The turbo code was proposed by Berrou, Glavieux, and Thitimajshima in 1993, and exhibits a superior performance that approximates a channel capacity limit of Shannon's channel coding theorem. The proposal of the turbo code triggered active research on iterative decoding and graphical expression of codes, and LDPC codes proposed by Gallager in 1962 have been newly spotlighted in the research. Cycles exist in a factor graph of the turbo code and the LDPC code, and it is well known that iterative decoding in the factor graph of the LDPC code, where cycles exist, is suboptimal. Also, it has been experimentally proven that the LDPC code has excellent performance through iterative decoding. The LDPC code known to have the highest performance ever exhibits performances having a difference of only about 0.04 [dB] at a channel capacity limit of Shannon's channel coding theorem at a bit error rate (BER) $10^{-5}$, using a block size $10^7$. In addition, although an LDPC code defined in Galois Field (GF) with q>2, i.e., GF(q), increases in complexity in its decoding process, it is much superior in performance to a binary code. However, there is no satisfactory theoretical description of successful decoding by an iterative decoding algorithm for the LDPC code defined in GF(q).

The LDPC code, proposed by Gallager, is defined by a parity check matrix in which major elements have a value of 0 and minor elements except the elements having the value of 0 have a non-zero value, e.g., a value of 1. In the following description, it will be assumed that a non-zero value is a value of 1.

For example, an (N, j, k) LDPC code is a linear block code having a block length N, and is defined by a sparse parity check matrix in which each column has j elements having a value of 1, each row has k elements having a value of 1, and all of the elements except for the elements having the value of 1 have a value of 0.

An LDPC code in which a weight of each column in the parity check matrix is fixed to 'j' and a weight of each row in the parity check matrix is fixed to 'k' as described above, is called a "regular LDPC code." Herein, the "weight" refers to the number of elements having a non-zero value among the elements constituting the parity check matrix. Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, in the case of the irregular LDPC code, because the weight of each column and the weight of each row in the parity check matrix are not fixed, i.e., are irregular, the weight of each column in the parity check matrix and the weight of each row in the parity check matrix must be properly adjusted in order to guarantee the superior performance.

FIG. 2 is a diagram illustrating a parity check matrix of a conventional (8, 2, 4) LDPC code. Referring to FIG. 2, a parity check matrix H of the (8, 2, 4) LDPC code is comprised of 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code illustrated in FIG. 2 becomes a regular LDPC code.

FIG. 3 is a diagram illustrating a factor graph of the (8, 2, 4) LDPC code of FIG. 2. Referring to FIG. 3, a factor graph of the (8, 2, 4) LDPC code is comprised of 8 variable nodes of $x_1$ 300, $x_2$ 302, $x_3$ 304, $x_4$ 306, $x_5$ 308, $x_6$ 310, $x_7$ 312 and $x_8$ 314, and 4 check nodes 316, 318, 320 and 322. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform decoding through iterative decoding even in a block code having a relatively long length, that exhibits performance approximating a channel capacity limit of Shannon's channel coding theorem, such as a turbo code, while continuously increasing a block length of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles on a Factor Graph of an LDPC Code Should be Considered.

The term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. In contrast, a short cycle means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. That is, when long cycles are generated in the factor graph of the LDPC code, it is possible to prevent performance degradation such as an error floor occurring when too many cycles with a short length exist on the factor graph of the LDPC code.

(2) Efficient Coding of an LDPC Code Should be Considered.

It is difficult for the LDPC code to undergo real-time coding compared with a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be taken into consideration.

(3) Degree Distribution on a Factor Graph of an LDPC Code Should be Considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" on a factor graph of an LDPC code refers to a ratio of the number of nodes having a particular degree to the total number of nodes. It has been proven by Richardson that an LDPC code having a particular degree distribution is superior in performance.

FIG. 4 is a diagram illustrating a parity check matrix of a conventional block LDPC code. Before a description of FIG. 4 is given, it should be noted that the block LDPC code is a new LDPC code for which not only efficient coding but also efficient storage and performance improvement of a parity check matrix were considered, and the block LDPC code is an LDPC code extended by generalizing a structure of a regular LDPC code. Referring to FIG. 4, a parity check matrix of the block LDPC code is divided into a plurality of partial blocks, and a permutation matrix is mapped to each of the partial blocks. In FIG. 4, 'P' represents a permutation matrix having an $N_s \times N_s$ size, and a superscript (or exponent) $a_{pq}$ of the permutation matrix P is either $0 \leq a_{pq} \leq N_s-1$ or $a_{pq}=\infty$.

In addition, 'p' indicates that a corresponding permutation matrix is located in the $p^{th}$ row of the partial blocks of the parity check matrix, and 'q' indicates that a corresponding permutation matrix is located in the $q^{th}$ column of the partial blocks of the parity check matrix. That is, $P^{a_{pq}}$ represents a permutation matrix located in a partial block where the $p^{th}$ row and the $q^{th}$ column of the parity check matrix comprised of a plurality of partial blocks cross each other. That is, the 'p' and the 'q' represent the number of rows and the number of columns of partial blocks corresponding to an information part in the parity check matrix, respectively.

FIG. 5 is a diagram illustrating the permutation matrix P of FIG. 4. As illustrated in FIG. 5, the permutation matrix P is a square matrix having an $N_s \times N_s$ size, and each of $N_s$ columns constituting the permutation matrix P has a weight of 1 and each of $N_s$ rows constituting the permutation matrix P also has a weight of 1. Herein, although a size of the permutation matrix P is expressed as $N_s \times N_s$, it will also be expressed as $N_s$ because the permutation matrix P is a square matrix.

In FIG. 4, a permutation matrix P with a superscript $a_{pq}=0$, i.e. a permutation matrix $P^0$, represents an identity matrix $I_{N_s \times N_s}$, and a permutation matrix P with a superscript $a_{pq}=\infty$, i.e. a permutation matrix $P^\infty$, represents a zero matrix. Herein, $I_{N_s \times N_s}$, represents an identity matrix with a size $N_s \times N_s$.

In the entire parity check matrix of the block LDPC code illustrated in FIG. 4, because the total number of rows is $N_s \times p$ and the total number of columns is $N_s \times q$ (for $p \leq q$), when the entire parity check matrix of the LDPC code has a full rank, a coding rate can be expressed as Equation (1) regardless of a size of the partial blocks.

$$R = \frac{N_s \times q - N_s \times p}{N_s \times q} = \frac{q-p}{q} = 1 - \frac{p}{q} \quad (1)$$

If $a_{pq} \neq \infty$ for all p and q, the permutation matrices corresponding to the partial blocks are not zero matrices, and the partial blocks constitute a regular LDPC code in which the weight value of each column and the weight value of each row in each of the permutation matrices corresponding to the partial blocks are p and q, respectively. Herein, each of permutation matrices corresponding to the partial blocks will be referred to as a "partial matrix."

Because (p−1) dependent rows exist in the entire parity check matrix, a coding rate is greater than the coding rate calculated by Equation (1). In the case of the block LDPC code, if a weight position of a first row of each of the partial matrices constituting the entire parity check matrix is determined, the weight positions of the remaining ($N_s$−1) rows can be determined. Therefore, the required size of a memory is reduced to 1/Ns as compared with the case where the weights are irregularly selected to store information on the entire parity check matrix.

As described above, the term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. As cycles in the factor graph of the LDPC code become longer, the performance efficiency of the LDPC code increases.

In contrast, as cycles in the factor graph of the LDPC code become shorter, an error correction capability of the LDPC code decreases because performance degradation such as an error floor occurs. That is, when there are many cycles with a short length in a factor graph of the LDPC code, information on a particular node belonging to the cycle with a short length, starting therefrom, returns after a small number of iterations. As the number of iterations increases, the information returns to the corresponding node more frequently, so that the information cannot be correctly updated, thereby causing deterioration in an error correction capability of the LDPC code.

FIG. 6 is a diagram illustrating a cycle structure of a block LDPC code of which a parity check matrix is comprised of 4 partial matrices. Before a description of FIG. 6 is given, it should be noted that the block LDPC code is a new LDPC code for which not only efficient coding but also efficient storage and performance improvement of a parity check matrix were considered. The block LDPC code is also an LDPC code extended by generalizing a structure of a regular LDPC code. A parity check matrix of the block LDPC code illustrated in FIG. 6 is comprised of 4 partial blocks, a diagonal line represents a position where the elements having a value of 1 are located, and the portions other than the diagonal-lined portions represent positions where the elements having a value of 0 are located. In addition, 'P' represents the same permutation matrix as the permutation matrix described in conjunction with FIG. 5.

In order to analyze a cycle structure of the block LDPC code illustrated in FIG. 6, an element having a value of 1 located in an $i^{th}$ row of a partial matrix $P^a$ is defined as a reference element, and an element having a value of 1 located in the $i^{th}$ row will be referred to as a "0-point." Herein, "partial matrix" will refer to a matrix corresponding to the partial block. The 0-point is located in an $(i+a)^{th}$ column of the partial matrix $P^a$.

An element having a value of 1 in a partial matrix $P^b$, located in the same row as the 0-point, will be referred to as a "1-point." For the same reason as the 0-point, the 1-point is located in an $(i+b)^{th}$ column of the partial matrix $P^b$.

Next, an element having a value of 1 in a partial matrix $P^c$, located in the same column as the 1-point, will be referred to as a "2-point." Because the partial matrix $P^c$ is a matrix acquired by shifting respective columns of an identity matrix I to the right with respect to a modulo $N_s$ by c, the 2-point is located in an $(i+b-c)^{th}$ row of the partial matrix $P^c$.

In addition, an element having a value of 1 in a partial matrix $P^d$, located in the same row as the 2-point, will be referred to as a "3-point." The 3-point is located in an $(i+b-c+d)^{th}$ column of the partial matrix pd.

Finally, an element having a value of 1 in the partial matrix $P^a$, located in the same column as the 3-point, will be referred to as a "4-point." The 4-point is located in an $(i+b-c+d-a)^{th}$ row of the partial matrix $P^a$.

In the cycle structure of the LDPC code illustrated in FIG. 6, if a cycle with a length of 4 exists, the 0-point and the 4-point are located in the same position. That is, a relation between the 0-point and the 4-point is defined by Equation (2)

$i \cong i+b-c+d-a (mod N_s)$ or $i+a \cong i+b-c+d (mod N_s)$ \quad (2)

Equation (2) can be rewritten as Equation (3)

$a+c \cong b+d (mod N_s)$ \quad (3)

As a result, when the relationship of Equation (3) is satisfied, a cycle with a length 4 is generated. Generally, when a 0-point and a 4p-point are first identical to each other, a relation of $i \cong i+p(b-c+d-e)(mod N_s)$ is given, and the following relation shown in Equation (4) is satisfied.

$p(a-b+c-d) \cong 0 (mod N_s)$ \quad (4)

In other words, if a positive integer having a minimum value among the positive integers satisfying Equation (4) for a given a, b, c and d is defined as 'p', a cycle with a length of 4p becomes a cycle having a minimum length in the cycle structure of the block LDPC code illustrated in FIG. 6.

In conclusion, as described above, for $(a-b+c-d) \neq 0$, if $gcd(N_s, a-b+c-d)=1$ is satisfied, then $p=N_s$. Herein, the gcd $(N_s, a-b+c-d)$ is the function for calculating the "greatest common divisor" of the integers $N_s$ and a−b+c−d. Therefore, a cycle with a length of $4N_s$ becomes a cycle with a minimum length.

A Richardson-Urbanke technique will be used as a coding technique for the block LDPC code. Because the Richardson-Urbanke technique is used as a coding technique, coding complexity can be minimized as the form of a parity check matrix becomes similar to the form of a full lower triangular matrix.

Figure 7:
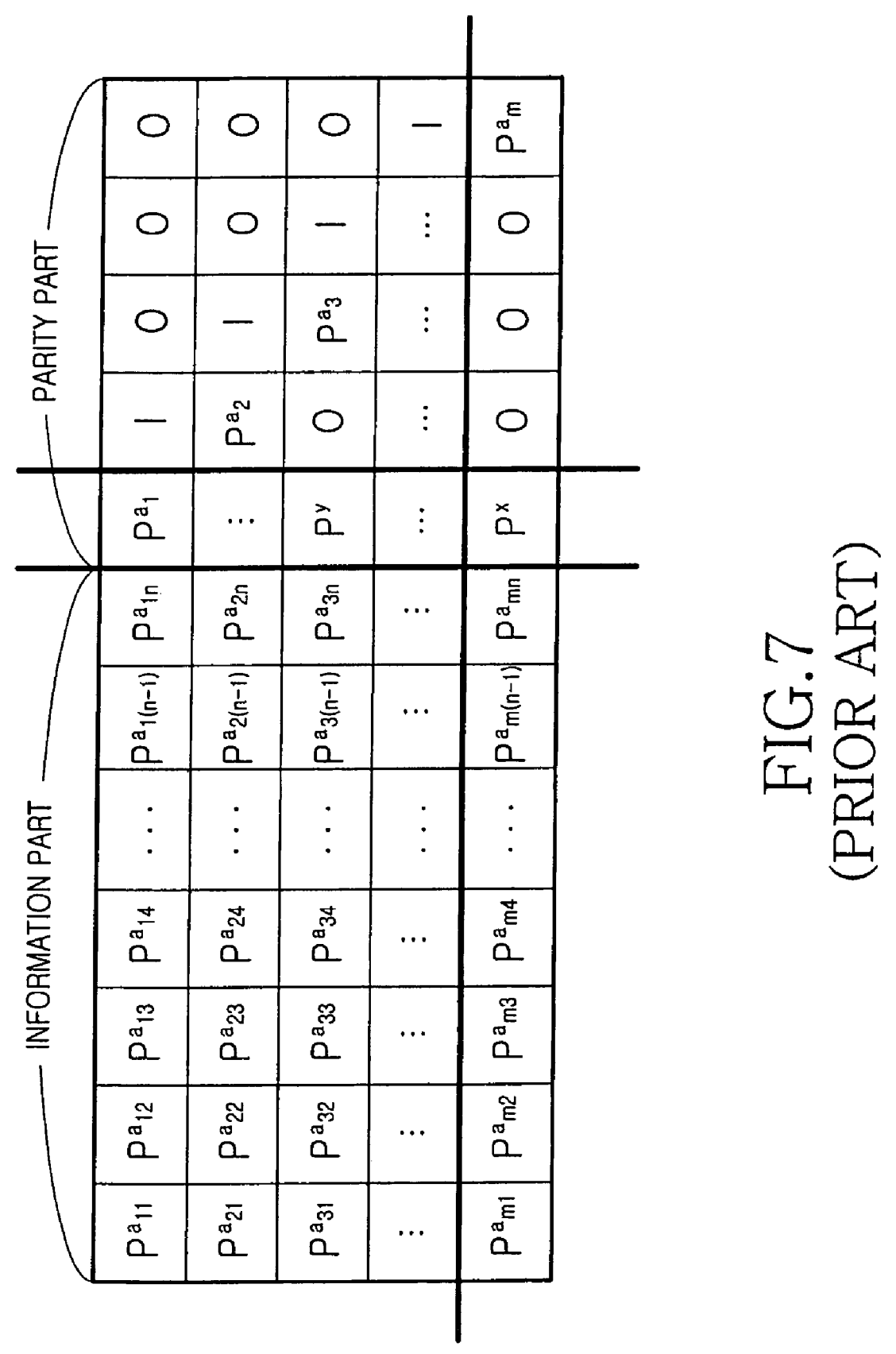

FIG. 7 is a diagram illustrating a parity check matrix having a form similar to the form of the full lower triangular matrix. The parity check matrix illustrated in FIG. 7 is different from the parity check matrix having a form of the full lower triangular matrix in the form of the parity part. In FIG. 7, a superscript (or exponent) $a_{pq}$ of the permutation matrix P of an information part is either $0 \leq a_{pq} \leq N_s-1$ or $a_{pq}=\infty$, as described above. A permutation matrix P with a superscript $a_{pq}=0$, i.e. a permutation matrix $P^0$, of the information part represents an identity matrix $I_{N_s \times N_s}$, and a permutation matrix P with a superscript $a_{pq}=\infty$, i.e. a permutation matrix $P^\infty$, represents a zero matrix. In. FIG. 7, 'p' represents the number of rows of partial blocks mapped to the information part, and 'q' represents the number of columns of partial blocks mapped to the parity part. Also, superscripts $a_p$, x and y of the permutation matrices P mapped to the parity part represent exponents of the permutation matrix P. However, for the convenience of explanation, the different superscripts $a_p$, x and y are used to distinguish the parity part from the information part. That is, in FIG. 7, $P^{a_1}$ and $P^{a_p}$ are also permutation matrices, and the superscripts $a_1$ to $a_p$ are sequentially indexed to partial matrices located in a diagonal part of the parity part. In addition, $P^x$ and $P^y$ are also permutation matrices, and for the convenience of explanation, they are indexed in a different way to distinguish the parity part from the information part. If a block length of a block LDPC code having the parity check matrix illustrated in FIG. 7 is assumed to be N, the coding complexity of the block LDPC code linearly increases with respect to the block length N (0(N)).

The biggest problem of the LDPC code having the parity check matrix of FIG. 7 is that if a length of a partial block is defined as $N_s$, $N_s$ check nodes whose degrees are always 1 in a factor graph of the block LDPC code are generated. The check nodes with a degree of 1 cannot affect the performance improvement based on the iterative decoding. Therefore, a standard irregular LDPC code based on the Richardson-Urbanke technique does not include a check node with a degree of 1. Therefore, a parity check matrix of FIG. 7 will be assumed as a basic parity check matrix in order to design a parity check matrix such that it enables efficient coding while not including a check node with a degree of 1. In the parity check matrix of FIG. 7 comprised of the partial matrices, the selection of a partial matrix is a very important factor for a performance improvement of the block LDPC code, so that finding an appropriate selection criterion for the partial matrix also becomes a very important factor.

In order to facilitate a method of designing a parity check matrix of the block LDPC code and a method for coding the block LDPC code, the parity check matrix illustrated in FIG. 7 is assumed to be formed with 6 partial matrices as illustrated in FIG. 8.

FIG. 8 is a diagram illustrating the parity check matrix of FIG. 7, which is divided into 6 partial blocks. Referring to FIG. 8, a parity check matrix of the block LDPC code illustrated in FIG. 7 is divided into an information part 's', a first parity part $p_1$, and a second parity part $p_2$. The information part 's' represents a part of the parity check matrix, mapped to an actual information word during the process of coding a block LDPC code, like the information part described in conjunction with FIG. 7, but for the convenience of explanation, the information part 's' is represented by different reference letters. The first parity part $p_1$ and the second parity part $p_2$ represent a part of the parity check matrix, mapped to an actual parity during the process of coding the block LDPC code, like the parity part described in conjunction with FIG. 7, and the parity part is divided into two parts.

Partial matrices A and C correspond to partial blocks A (802) and C (804) of the information part 's', partial matrices B and D correspond to partial blocks B (806) and D (808) of the first parity part $p_1$, and partial matrices T and E correspond to partial blocks T (810) and E (812) of the second parity part $p_2$. Although the parity check matrix is divided into 7 partial blocks in FIG. 8, it should be noted that '0' is not a separate partial block and because the partial matrix T corresponding to the partial block T (810) have a full lower triangular form, a region where zero matrices are arranged on the basis of a diagonal is represented by '0'. A process of simplifying a coding method using the partial matrices of the information part 's', the first parity part $p_1$ and the second parity part $p_2$ will be described later with reference to FIG. 10.

Figure 9:
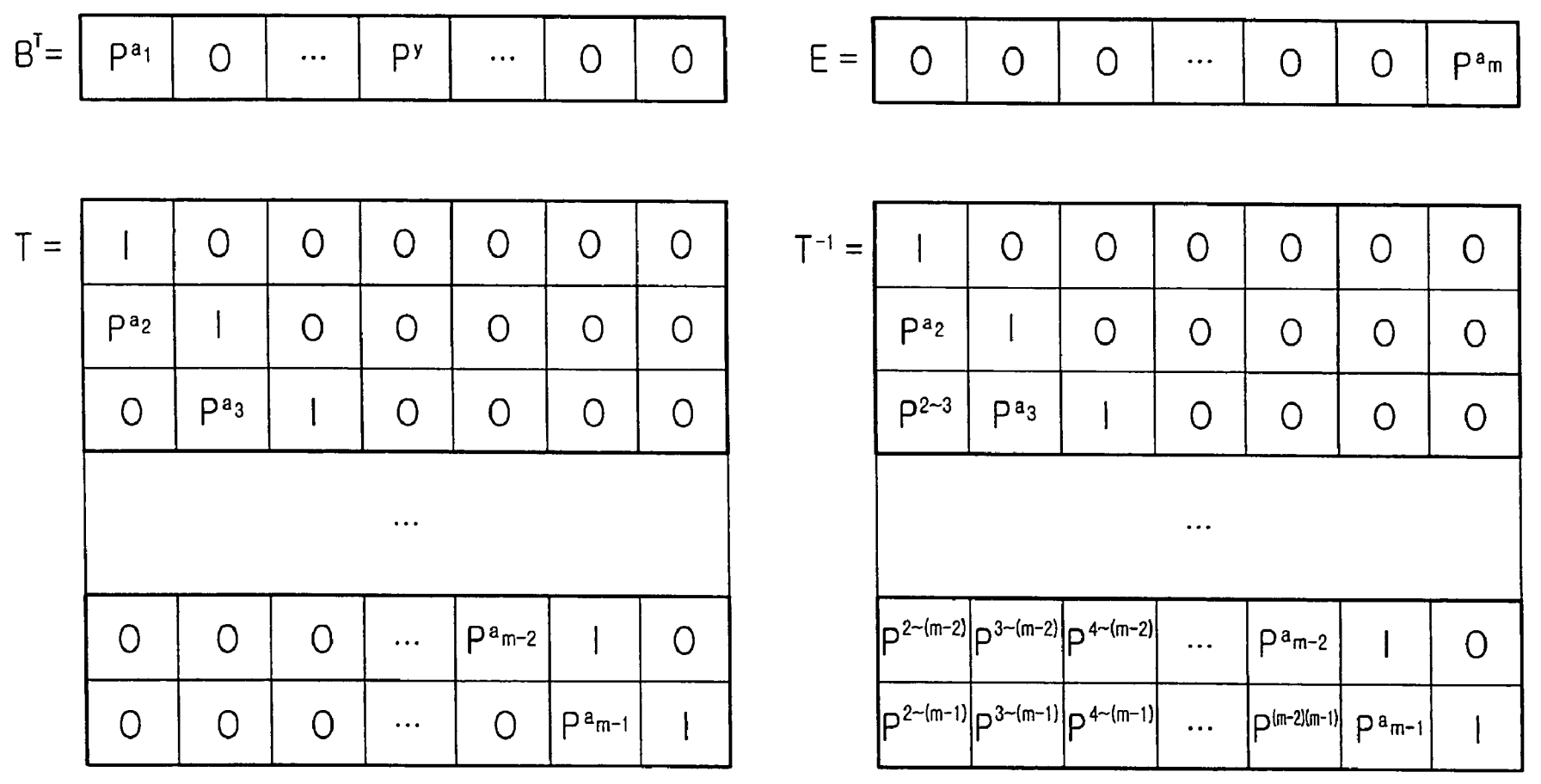

FIG. 9 is a diagram illustrating a transpose matrix of the partial matrix B shown in FIG. 8, the partial matrix E, the partial matrix T, and an inverse matrix of the partial matrix T, in the parity check matrix of FIG. 7. Referring to FIG. 9, a partial matrix $B^T$ represents a transpose matrix of the partial matrix B, and a partial matrix $T^{-1}$ represents an inverse matrix of the partial matrix T. The $p^{(k_1-k_2)}$ represents $$\prod_{i=k_i}^{k_2} P^{a_i} = P^{\sum_{i=k_i}^{k_2} a_i}.$$

The permutation matrices illustrated in FIG. 9, for example, $P^{a_i}$, may be an identity matrix. As described above, if a superscript of the permutation matrix, i.e., $a_1$ is 0, the $P^{a_i}$ will be an identity matrix. Also, if a superscript of the permutation matrix, i.e., $a_1$ increases by a predetermined value, the permutation matrix is cyclic shifted by the predetermined value, so the permutation matrix $P^{a_i}$ will be an identity matrix.

FIG. 10 is a flowchart illustrating a procedure for generating a parity check matrix of a conventional block LDPC code. Before a description of FIG. 10 is given, it should be noted that in order to generate a block LDPC code, a codeword size and a coding rate of a block LDPC code to be generated must be determined, and a size of a parity check matrix must be determined according to the determined codeword size and coding rate. If a codeword size of the block LDPC code is represented by N and a coding rate is represented by R, a size of a parity check matrix becomes N(1−R)×N. Actually, the procedure for generating a parity check matrix of a block LDPC code illustrated in FIG. 10 is performed only once, because the parity check matrix is initially generated to be suitable for a situation of a communication system and thereafter, the generated parity check matrix is used.

Referring to FIG. 10, in step 1011, a controller divides a parity check matrix with the size N(1−R)×N into a total of p×q blocks, including p blocks in a horizontal axis and q blocks in a vertical axis, and then proceeds to step 1013. Because each of the blocks has a size of $N_s \times N_s$, the parity check matrix is comprised of $N_s \times p$ columns and $N_s \times q$ rows. In step 1013, the controller classifies the p×q blocks divided from the parity check matrix into an information part 's', a first parity part $p_1$, and a second parity part $p_2$, and then proceeds to steps 1015 and 1021.

In step 1015, the controller separates the information part 's' into non-zero blocks, or non-zero matrices, and zero blocks, or zero matrices according to a degree of distribution for guaranteeing a good performance of the block LDPC code, and then proceeds to step 1017. Because the degree of distribution for guaranteeing a good performance of the block LDPC code has been described above, a detailed description thereof will omitted herein. In step 1017, the controller determines the permutation matrices $P^{a_{pq}}$ such that a minimum cycle length of a block cycle should be maximized as described above in the non-zero matrix portions in blocks having a low degree from among the blocks determined according to the degree distribution for guaranteeing a good performance of the block LDPC code, and then proceeds to step 1019. The permutation matrices $P^{a_{pq}}$ should be determined taking into consideration the block cycles of not only the information part 's' but also the first parity part $p_1$ and the second parity part $p_2$.

In step 1019, the controller randomly determines the permutation matrices $P^{a_{pq}}$ in the non-zero matrix portions in the blocks having a high degree among the blocks determined according to the degree distribution for guaranteeing a good performance of the block LDPC code, and then ends the procedure. Even when the permutation matrices $P^{a_{pq}}$ to be applied to the non-zero matrix portions in the blocks having a high degree are determined, the permutation matrices $P^{a_{pq}}$ must be determined, such that a minimum cycle length of a block cycle is maximized, and the permutation matrices $P^{a_{pq}}$ are determined considering the block cycles of not only the information part 's' but also the first parity part $p_1$ and the second parity part $p_2$. An example of the permutation matrices $P^{a_{pq}}$ arranged in the information part 's' of the parity check matrix is illustrated in FIG. 7.

In step 1021, the controller divides the first part $p_1$ and the second parity part $p_2$ into 4 partial matrices B, T, D and E, and then proceeds to step 1023. In step 1023, the controller inputs the non-zero permutation matrices $P^y$ and $p^{a_1}$ to 2 partial blocks among the partial blocks constituting the partial matrix B, and then proceeds to step 1025. The structure for inputting the non-zero permutation matrices $P^y$ and $P^{a_1}$ to 2 partial blocks among the partial blocks constituting the partial matrix B has been described with reference to FIG. 9.

In step 1025, the controller inputs the identity matrices I to the diagonal partial blocks of the partial matrix T, inputs the particular permutation matrices $p^{a_2}, P^{a_3}, \ldots, P^{a_{m-1}}$ to $(i, i+1)^{th}$ partial blocks under the diagonal components of the partial matrix T, and then proceeds to step 1027. The structure for inputting the identity matrices I to the diagonal partial blocks of the partial matrix T and inputting the particular permutation matrices $P^{a_2}, P^{a_3}, \ldots, P^{a_{m-1}}$ to $(i, i+1)^{th}$ partial blocks under the diagonal components of the partial matrix T has been described with reference to FIG. 9.

In step 1027, the controller inputs a partial matrix $P^x$ to the partial matrix D, and then proceeds to step 1029. In step 1029, the controller inputs a permutation matrix $P^{a_m}$ to only the last partial block in the partial matrix E, and then ends the procedure. The structure for inputting the 2 permutation matrices $P^{a_m}$ to only the last partial block among the partial blocks constituting the partial matrix E has been described with reference to FIG. 9.

SUMMARY OF THE INVENTION

As described above, it is known that the LDPC code, together with the turbo code, has a high performance gain during high-speed data transmission and effectively corrects an error caused by noises generated in a transmission channel, contributing to an increase in reliability of data transmission. However, the LDPC code is disadvantageous in terms of the coding rate. That is, because the LDPC code has a relatively high coding rate, it has a limitation in terms of the coding rate. Among the currently available LDPC codes, major LDPC codes have a coding rate of 1/2 and only minor LDPC codes have a coding rate of 1/3. The limitation in the coding rate exerts a fatal influence on high-speed, high-capacity data transmission. Although a degree distribution representing the best performance can be calculated using a density evolution scheme in order to implement a relatively low coding rate for the LDPC code, it is difficult to implement an LDPC code having a degree distribution representing the best performance due to various restrictions, such as a cycle structure in a factor graph and hardware implementation.

With the development of the mobile communication system, various schemes such as Hybrid Automatic Retransmission Request (HARQ) and an Adaptive Modulation and Coding (AMC) are used to increase resource efficiency. In order to use the HARQ and AMC schemes, the LDPC codes should be able to support various coding rates. However, because the LDPC codes have limitations in terms of the coding rate as described above, it is hard for the LDPC codes to support various coding rates.

Additionally, in order to use the HARQ scheme, it is necessary to create LDPC codes having various coding rates using one encoder. Accordingly, there is a demand for a scheme capable of creating LDPC codes with various coding rates using one encoder.

It is, therefore, an object of the present invention to provide an apparatus and method for coding and decoding an LDPC code having a variable coding rate in a mobile communication system.

It is another object of the present invention to provide an apparatus and method for coding and decoding an LDPC code having a variable coding rate, coding complexity of which is minimized, in a mobile communication system.

According to an aspect of the present invention, there is provided a method for coding a block Low Density Parity Check (LDPC) code having a variable coding rate. The method includes the steps of receiving an information word; and encoding the information word into a block LDPC code based on one of a first parity check matrix and a second parity check matrix, depending on a coding rate to be applied when generating the information word into the block LDPC code.

According to another aspect of the present invention, there is provided an apparatus for encoding a block Low Density Parity Check (LDPC) code having a variable coding rate. The apparatus includes an encoder for coding an information word into a block LDPC code based on one of a first parity check matrix and a second parity check matrix depending on a coding rate to be applied when generating the information word into the block LDPC code; a modulator for modulating the block LDPC code into a modulated symbol using a modulation scheme; and a transmitter for transmitting the modulated symbol.

According to further another aspect of the present invention, there is provided a method for decoding a block Low Density Parity Check (LDPC) code having a variable coding rate. The method includes the steps of receiving a signal; determining one of a first parity check matrix and a second parity check matrix according to a coding rate of a block LDPC code to be decoded; and decoding the received signal according to the determined parity check matrix in order to detect the block LDPC code.

According to still another aspect of the present invention, there is provided an apparatus for decoding a block Low Density Parity Check (LDPC) code having a variable coding rate. The apparatus includes a receiver for receiving a signal; and a decoder for determining one of a first parity check matrix and a second parity check matrix according to a coding rate of a block LDPC code to be decoded, and decoding the received signal according to the determined parity check matrix in order to detect the block LDPC code.

BRIEF DESCRIPTION OF THE DRAWINGS

The above and other objects, features, and advantages of the present invention will become more apparent from the following detailed description when taken in conjunction with the accompanying drawings in which:

FIG. 4 is a diagram illustrating a parity check matrix of a conventional block LDPC code;

FIG. 5 is a diagram illustrating the permutation matrix P of FIG. 4;

FIG. 7 is a diagram illustrating a parity check matrix having a form similar to the form of a full lower triangular matrix;

FIG. 9 is a diagram illustrating a transpose matrix of a partial matrix B illustrated in FIG. 8, a partial matrix E, a partial matrix T, and an inverse matrix of the partial matrix T;

FIG. 23 is a diagram illustrating a parity check matrix for a variable-coding rate block LDPC code according to an embodiment of the present invention;

FIG. 24 is a diagram illustrating a parity check matrix for a variable-coding rate block LDPC code according to an embodiment of the present invention.

DETAILED DESCRIPTION OF THE PREFERRED EMBODIMENT

Several preferred embodiments of the present invention will now be described in detail herein below with reference to the annexed drawings. In the following description, a detailed description of known functions and configurations incorporated herein has been omitted for conciseness.

Figures 1, 2:
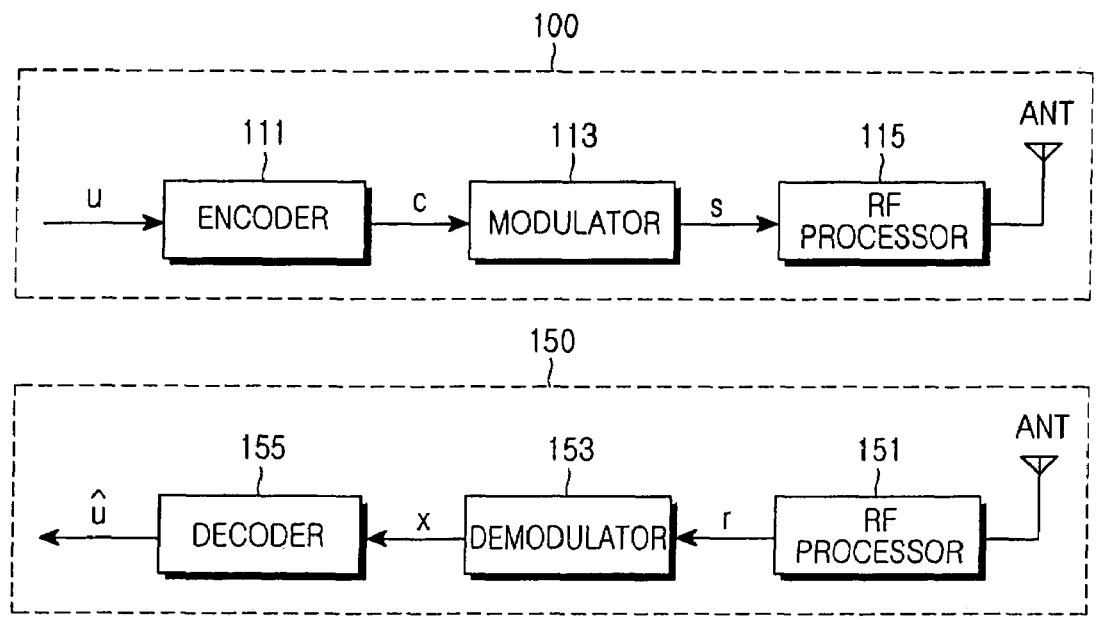
FIG. 1 is a diagram illustrating a transmitter/receiver in a conventional mobile communication system.
FIG. 2 is a diagram illustrating a parity check matrix of a conventional (8, 2, 4) LDPC code.
Figure 3:
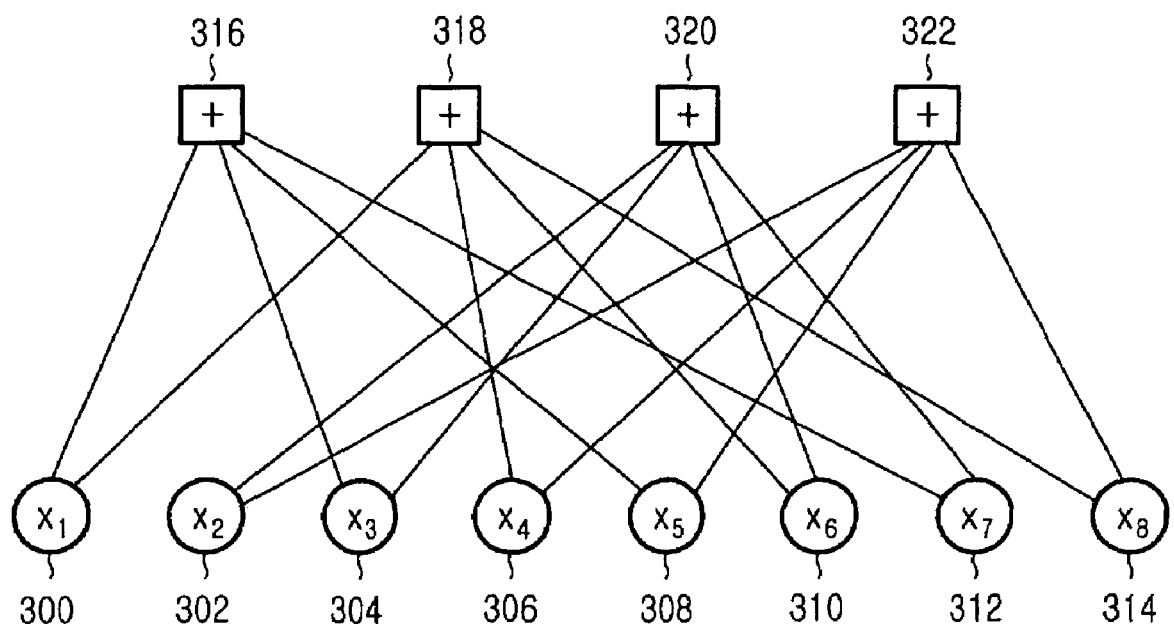
FIG. 3 is a diagram illustrating a factor graph of the (8, 2, 4) LDPC code of FIG. 2.
Figure 6:
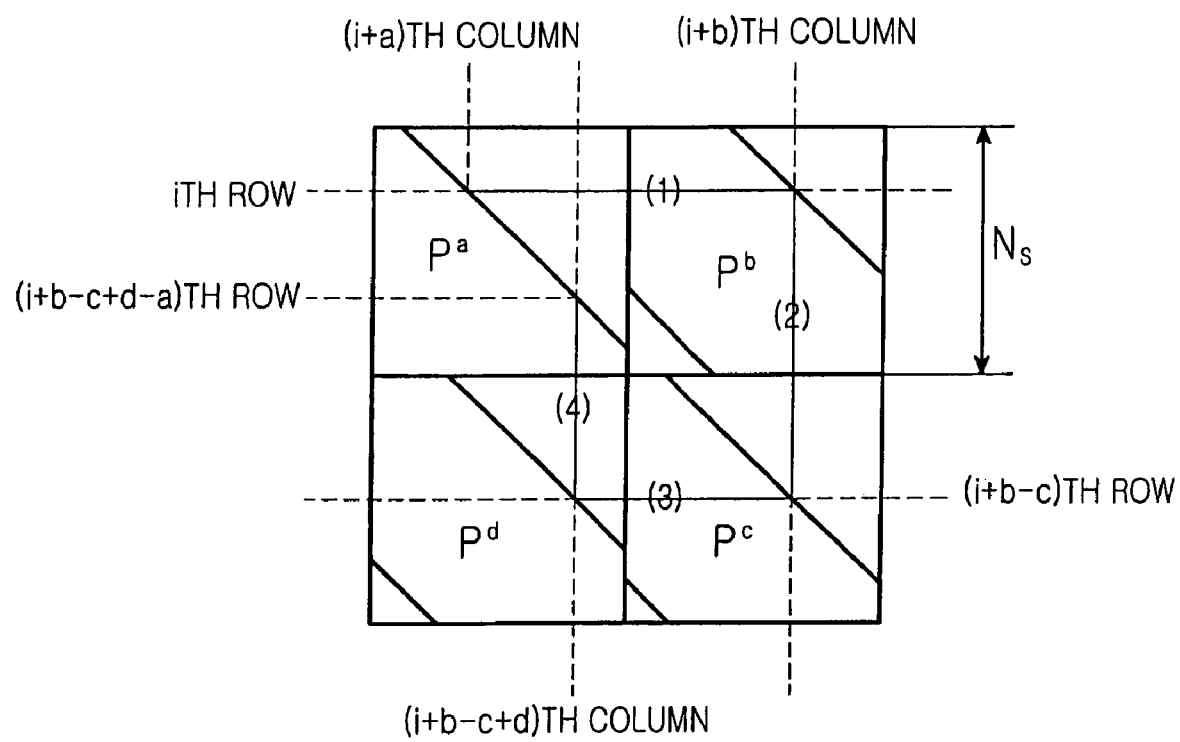
FIG. 6 is a diagram illustrating a cycle structure of a block LDPC code of which a parity check matrix is comprised of 4 partial matrices.

The present invention proposes an apparatus and method for encoding and decoding a block Low Density Parity Check (LDPC) code having a variable coding rate (hereinafter referred to as a "variable-coding rate block LDPC code"). That is, the present invention proposes an apparatus and method for encoding and decoding a variable-coding rate block LDPC code in which a length of the minimum cycle in a factor graph of a block LDPC code is maximized, the coding complexity of the block LDPC code is minimized, a degree distribution in the factor graph of the block LDPC code has an optimal value of 1, and the variable coding rate is supported. Although not separately illustrated in the specification, the encoding and decoding apparatus for a variable-coding rate block LDPC code according to the present invention can be applied to the transmitter/receiver described with reference to FIG. 1.

The next generation mobile communication system has evolved into a packet service communication system, and the packet service communication system, which is a system for transmitting burst packet data to a plurality of mobile stations, has been designed to be suitable for high-capacity data transmission. In order to increase the data throughput, a Hybrid Automatic Retransmission Request (HARQ) scheme and an Adaptive Modulation and Coding (AMC) scheme have been proposed. As the HARQ scheme and the AMC scheme support a variable coding rate, there is a need for block LDPC codes supporting various coding rates.

The design of the variable-coding rate block LDPC code, like the design of a conventional LDPC code, is implemented through the design of a parity check matrix. However, in a mobile communication system, in order to provide a variable-coding rate block LDPC code with one CODEC, i.e., in order to provide block LDPC codes having various coding rates, the parity check matrix should include parity check matrices capable of representing block LDPC codes having different coding rates. That is, it is necessary to support at least two coding rates using one parity check matrix.

The schemes for supporting at least two coding rates using one parity check matrix include a shortening scheme, a removing scheme, and a puncturing scheme in the present invention. A description will now be made of the shortening scheme, the removing scheme and the puncturing scheme.

The shortening scheme decreases the coding rate by fixing the number of rows in the parity check matrix and decreasing the number of columns mapped to an information word. The shortening scheme is useful for acquiring various coding rates for various codeword lengths.

Figure 11:
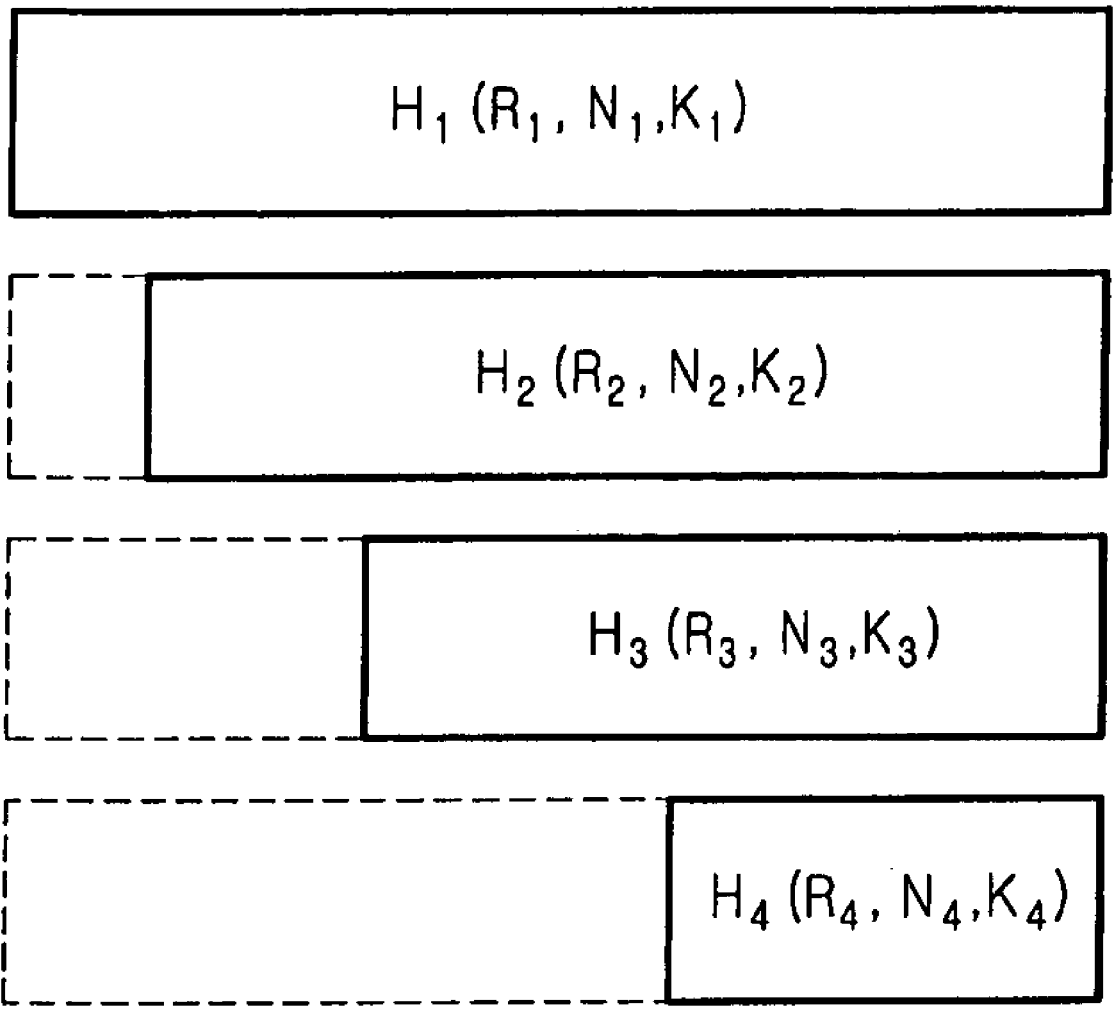
FIG. 11 is a diagram illustrating a process of generating a parity check matrix using a shortening scheme according to an embodiment of the present invention.

FIG. 11 is a diagram illustrating a process of generating a parity check matrix using a shortening scheme according to an embodiment of the present invention. Referring to FIG. 11, $H_i(R_i,N_i,K_i)$ represents a parity check matrix of a block LDPC code having a coding rate $R_i$, a codeword length $N_i$, and an information word length $K_i$, where for i<j, $N_i>N_j$ and $K_i>K_j$. A process in which a block LDPC code corresponding to a parity check matrix of $H_1(R_1,N_1,K_1)$ (hereinafter referred to as a "$(R_1,N_1,K_1)$-block LDPC code") changes to a block LDPC code corresponding to a parity check matrix of $H_2(R_2, N_2,K_2)$ (hereinafter referred to as a "$(R_2,N_2,K_2)$-block LDPC code") can be simply analogized assuming that first $(K_1-K_2)$ information bits of the $(R_1,N_1,K_1)$-block LDPC code are all fixed to zero (0). Also, $(R_i,N_i,K_i)$-block LDPC codes, other than the $(R_2,N_2,K_2)$-block LDPC code, can be simply generated by fixing all of the first $(K_1-K_i)$ information bits of the $(R_1,N_1,K_1)$-block LDPC code to '0'.

Therefore, in an operation of generating a parity check matrix using the shortening scheme as described in connection with FIG. 11, a coding rate of the corresponding block LDPC code can be expressed as shown in Equation (5).

$$R_1 = \frac{K_1}{N_1}, R_i = \frac{K_i}{N_i} = \frac{K_1 - (K_1 - K_i)}{N_1 - (K_1 - K_i)} \quad (5)$$

For i<j, Equation (5) can be expressed as shown in Equation (6).

$$R_i - R_j = \frac{K_1 - (K_1 - K_i)}{N_1 - (K_1 - K_i)} - \frac{K_1 - (K_1 - K_j)}{N_1 - (K_1 - K_j)} \quad (6)$$

$$= \frac{(N_1 - K_1)(K_i - K_j)}{(N_1 - (K_1 - K_i))(N_1 - (K_1 - K_j))} > 0$$

It can be seen from Equation (6) that a coding rate obtained when generating a parity check matrix using the shortening scheme is reduced.

Assuming in FIG. 11 that the parity check matrix $H_1(R_1, N_1,K_1)$ has a full rank, even though parity check matrices are generated using the shortening scheme, the number of rows in the parity check matrices generated using the shortening scheme remains constant. Therefore, the information word length is shortened whereas the parity length remains constant, thereby decreasing the coding rate. Generally, if the columns mapped to a parity part are removed from a predetermined parity check matrix, a generated codeword set is totally different from the codeword set generated when the columns mapped to the parity are not removed. Therefore, the shortening scheme has a basic principle of removing the columns mapped to an information word.

The removing scheme decreases the coding rate by fixing the number of columns and increasing the number of rows in the parity check matrix. Herein, increasing the number of rows in the parity check matrix represents increasing the number of check equations that should be satisfied by codewords. An increase in the number of the check equations decreases the number of codewords that satisfy the check equations. Accordingly, the "removing scheme" is named as such because it removes codewords that cannot satisfy check equations added due to the increase in the number of rows in the parity check matrix, from a reference codeword set.

Figure 12:
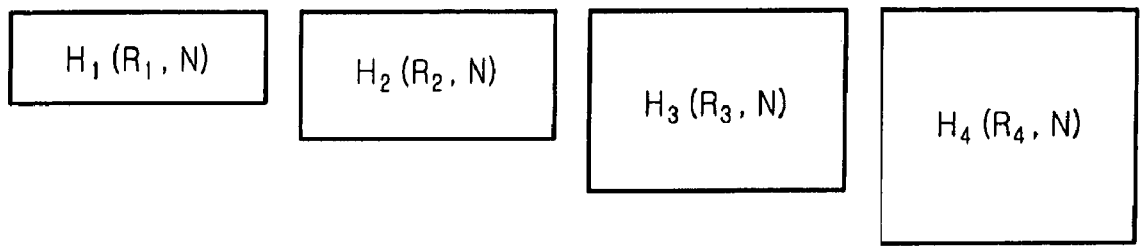
FIG. 12 is a diagram illustrating a process of generating a parity check matrix using a removing scheme according to an embodiment of the present invention.

FIG. 12 is a diagram illustrating a process of generating a parity check matrix using a removing scheme according to an embodiment of the present invention. Referring to FIG. 12, $H_i(R_i,N)$ represents a parity check matrix of a block LDPC code having a coding rate $R_i$ and a codeword length N. Assuming in FIG. 12 that each of parity check matrices has a full rank $M_i$, a coding rate of a code generated for each of the parity check matrices can be expressed as shown in Equation (7).

$$R_i = \frac{N - M_i}{N} = 1 - \frac{M_i}{N} \quad (7)$$

As shown in Equation (7), it is common that the full rank $M_i$ increases for 'i', causing a decrease in $R_i$. Alternatively, it is also possible to generate a parity check matrix having a high coding rate using a scheme of removing rows on the basis of a parity check matrix having a very low coding rate such as $H_4(R_4,N)$ illustrated in FIG. 12, unlike the removing scheme.

The puncturing scheme increases a coding rate by transmitting only a part of generated parities instead of transmitting all of the parities generated from an encoder like in the case of the turbo code. The puncturing scheme, although it does not transmit all of the generated parities, can consider that there is no change in the parity check matrix. Therefore, the puncturing scheme is different from the schemes of deleting or adding columns and rows of the parity check matrix, like the shortening scheme or the removing scheme.

Figure 13:
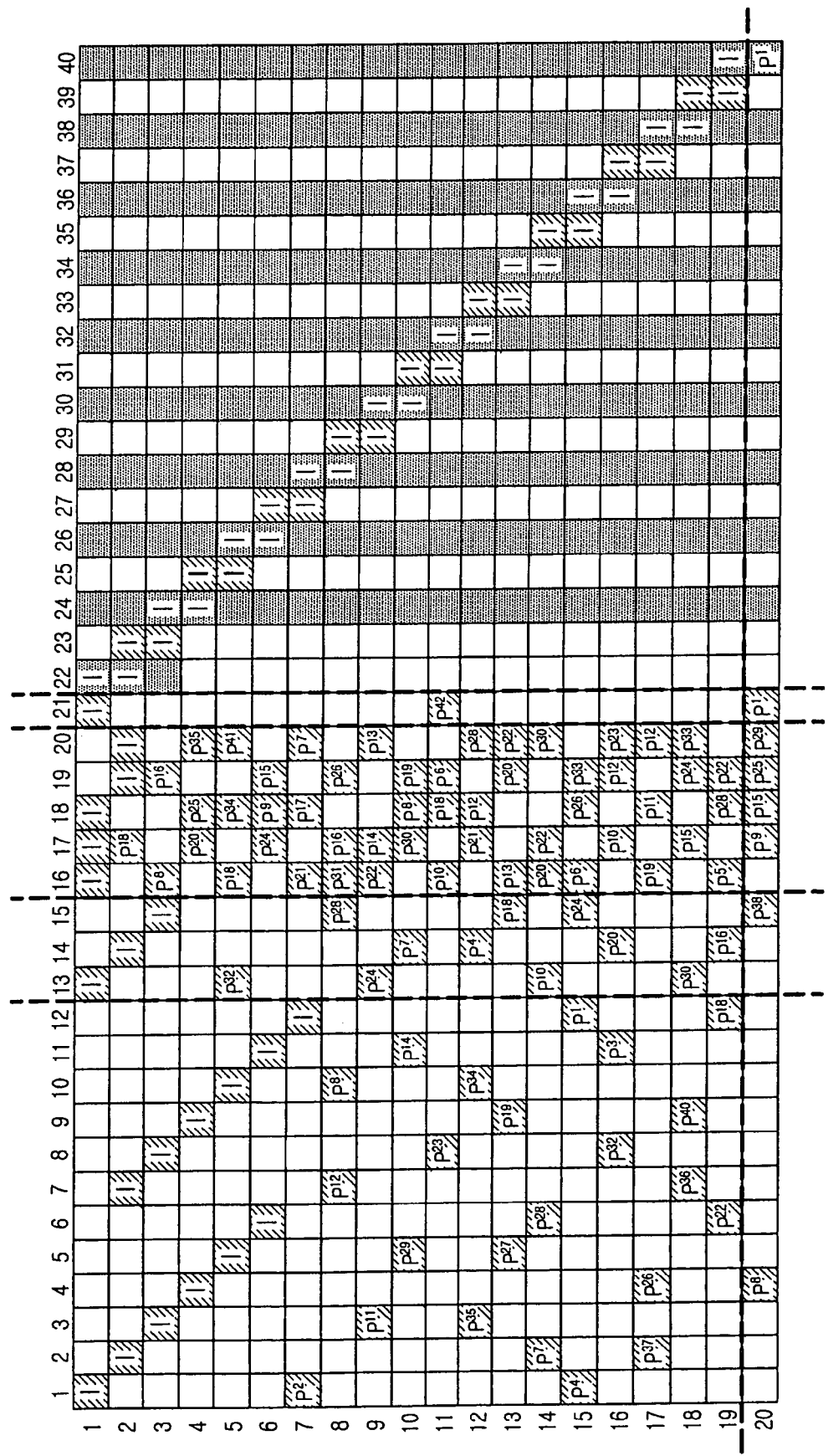
FIG. 13 is a diagram illustrating a process of generating a parity check matrix using a puncturing scheme according to an embodiment of the present invention.

FIG. 13 is a diagram illustrating a process of generating a parity check matrix using a puncturing scheme according to an embodiment of the present invention. Referring to FIG. 13, a parity check matrix for an (N,K)=(1720,860) block LDPC code with a coding rate of 1/2, includes 20×40 partial blocks. A partial matrix corresponding to each of the partial blocks is a square matrix, a size of which is $N_s \times N_s = 43 \times 43$.

When a codeword of the block LDPC code is divided into an information word and a parity word, the information word and the parity word also can be divided per partial block. Therefore, a codeword of the block LDPC code can be expressed as shown in Equation (8).

$$\underline{c} = (\underline{u}_1, \underline{u}_2, \ldots, \underline{u}_{20}, \underline{p}_1, \underline{p}_2, \ldots, \underline{p}_{20}) \quad (8)$$

In Equation (8), $\underline{u}_i$ and $\underline{p}_i$ denote 1×43-sized row vectors.

If even blocks are punctured from a parity part in the parity check matrix illustrated in FIG. 13, a codeword of the block LDPC code obtained by the puncturing can be expressed as shown in Equation (9).

$$\underline{c}_{punc} = (\underline{u}_1, \underline{u}_2, \ldots, \underline{u}_{20}, \underline{p}_1, \underline{p}_3, \underline{p}_5, \ldots, \underline{p}_{17}, \underline{p}_{19}) \quad (9)$$

In Equation (9), $\underline{c}_{punc}$ denotes a codeword of the block LDPC code obtained by the puncturing. As illustrated in Equation (9), the codeword becomes equal to a codeword of a block LDPC code with a coding rate of 2/3. That is, the use of the puncturing scheme changes a coding rate but maintains a length of the information word.

In the process of decoding a codeword of a block LDPC code generated using the puncturing scheme, the original parity check matrix is used by regarding the punctured parity bits as erased bits. That is, if a log-likelihood ratio (LLR) value input from a channel over which the punctured parity bits are transmitted is always regarded as '0', the original parity check matrix can be used as it is, during decoding. Therefore, a punctured node corresponding to parity never affects performance improvement or performance degradation due to iterative decoding in the decoding process, and merely serves as a path through which messages transmitted from other nodes pass.

FIGS. 14A to 14D are diagrams illustrating a role of a node corresponding to parity punctured in a decoding process for a codeword of a block LDPC code generated using a puncturing scheme according to an embodiment of the present invention. However, before a description of FIGS. 14A to 14D is given, $\widehat{x}$ illustrated in FIGS. 14A to 14D represents the punctured node corresponding to parity and an arrow represents a direction in which a message is actually transmitted.

Figure 14A:
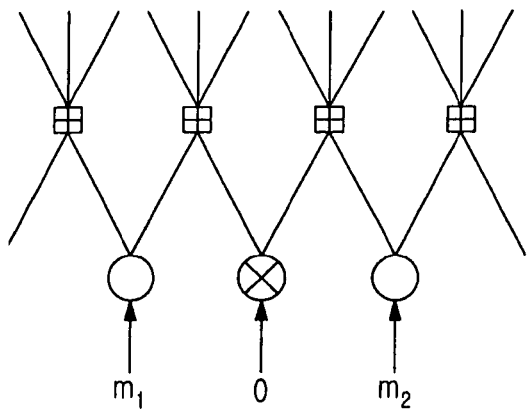
FIGS. 14A to 14D are diagrams for a description of a role of a parity node punctured in a decoding process for a codeword of a block LDPC code generated using a puncturing scheme according to an embodiment of the present invention.
Figure 14B:
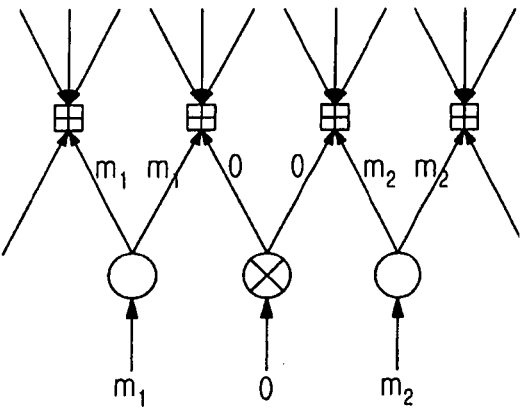

Referring to FIG. 14A, an LLR value '0' is input to the punctured parity node. Thereafter, a message input from the channel illustrated in FIG. 14A is delivered to check nodes in a first decoding process as illustrated in FIG. 14B. In FIG. 14B, variable nodes corresponding to parity are delivered to check nodes connected to the input message, i.e., symbol probability value. The variable node corresponding to parity delivers the LLR value '0' to the connected check nodes.

Figure 14C:
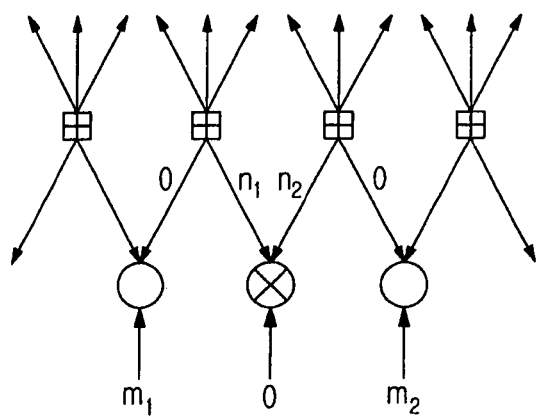
Figure 14D:
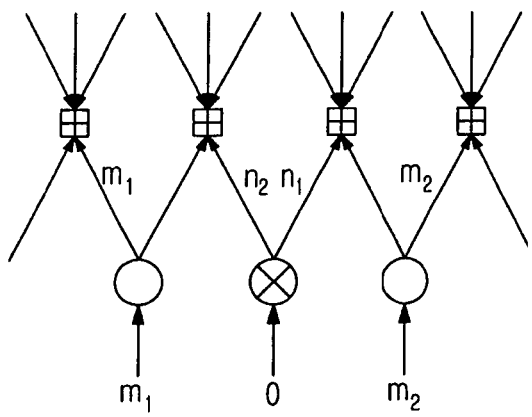

The check nodes calculate probability values to be delivered to each of variable nodes by performing a predetermined operation using probability values input from the variable nodes connected to the check nodes, and deliver the calculated probability values to the corresponding variable nodes. A message delivered to all nodes connected to the variable node corresponding to parity punctured from the check node becomes '0' as illustrated in FIG. 14C. In addition, a message delivered to the punctured variable node corresponding to parity is not '0', and the messages delivered to the punctured variable nodes corresponding to parity are independently delivered through their own paths without affecting each other as illustrated in FIG. 14D. The following decoding process is equal to the conventional decoding process for an LDPC code, and the punctured variable node corresponding to parity does not continuously affect performance improvement due to decoding and simply serves as a transmission path of messages.

As described above, in the puncturing scheme, the original encoder and decoder can be used for encoding and decoding. That is, in the puncturing scheme, the encoding complexity and the decoding complexity are almost constant regardless of a coding rate and a block (codeword) length, an information word length is fixed, and a coding rate is varied by varying only a parity length. Therefore, the puncturing scheme has high reliability. Because a block LDPC code generated using the puncturing scheme varies in performance depending on its puncturing pattern, the design of the puncturing pattern serves as an important factor.

Next, a detailed description will be made of a method for actually generating a block LDPC code using the shortening scheme and the puncturing scheme. Like the conventional block codes, the block LDPC code can also vary its coding rate using the shortening scheme. Therefore, the embodiment of the present invention varies a coding rate of the block LDPC code using the shortening scheme.

Figure 15:
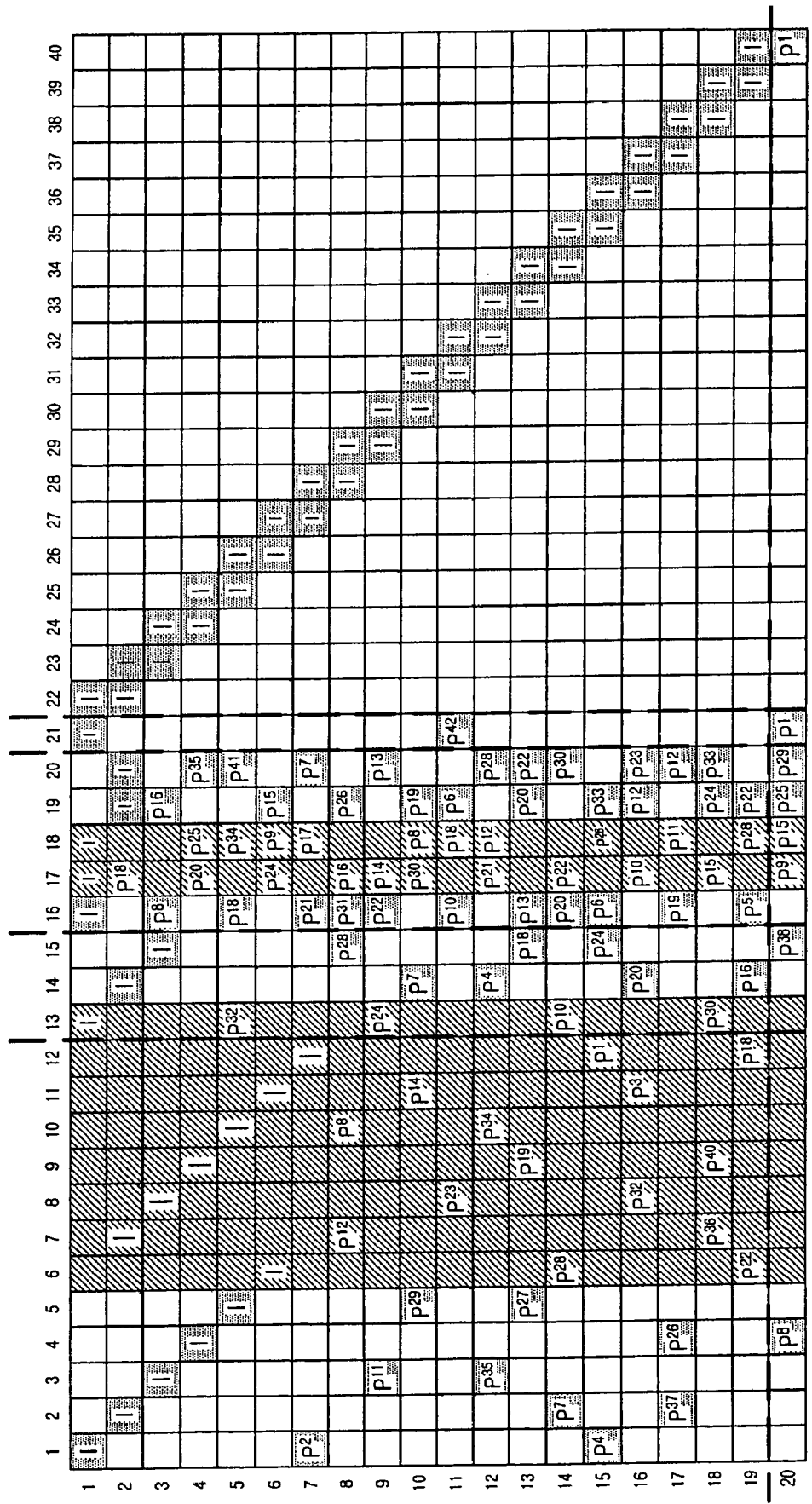
FIG. 15 is a diagram illustrating a process of generating a parity check matrix using a shortening scheme according to an embodiment of the present invention.

FIG. 15 is a diagram illustrating a process of generating a parity check matrix using a shortening scheme according to an embodiment of the present invention. Referring to FIG. 15, the illustrated parity check matrix is generated if $\underline{u}_6, \underline{u}_7, \ldots, \underline{u}_3, \underline{u}_{17}, \underline{u}_{18}$ of a codeword $\underline{c}$ of a block LDPC code corresponding to a parity check matrix described in connection with FIG. 13 are all regarded as '0'. Because the shortening scheme has removes a part of an information part from the parity check matrix, it is different from the puncturing scheme. That is, because a parity check matrix generated using the shortening scheme has totally different coding rate and degree of distribution from those of the initially given parity check matrix, it is necessary to select a column to be removed from the initially given parity check matrix considering a degree of distribution of the parity check matrix generated using the shortening scheme. Accordingly, it is necessary to generate the parity check matrix such that a parity check matrix initially given before the use of the shortening scheme, i.e., a parent parity check matrix, and a parity check matrix obtained after the use of the shortening scheme, i.e., a child parity check matrix, both can have the optimized degree distribution.

Generally, in the case of a finite length, a block LDPC code with a high coding rate showing high performance is higher in average degree of a check node than a block LDPC code with a low coding rate showing high performance. Therefore, to generate a block LDPC code with a low coding rate using the shortening scheme, it is necessary to decrease an average degree of a check node after using the shortening scheme.

In addition, because the use of the shortening scheme changes a degree distribution, in order to design a variable-coding rate block LDPC code having an excellent noise threshold using a density evolution analysis scheme, it is necessary to consider both a degree distribution of a parent parity check matrix and a degree distribution of a child parity check matrix generated using the shortening scheme. However, the puncturing scheme considers that a punctured variable node has been erased, rather than actually removing the punctured variable node. Therefore, the puncturing scheme can generate a block LDPC code with a high coding rate without causing a change in a degree of distribution of a parity check matrix on the whole.

Next, a description will be made of a method for generating a block LDPC code capable of supporting various coding rates, i.e., a variable coding rate, using one parity check matrix, i.e., one parent parity check matrix. Herein, a description will be made of a block LDPC code that has a fixed codeword length and a variable coding rate. In addition, a description will be made of a method for generating a block LDPC code capable of varying its coding rate from 1/3 to 1/2 using the shortening scheme and the puncturing scheme, as an example of a variable-coding rate block LDPC code of which a block length, i.e., a codeword length, is fixed, and allowing a parent parity check matrix and a child parity check matrix generated from the parent parity check matrix using the shortening scheme to have excellent noise threshold.

Figure 16:
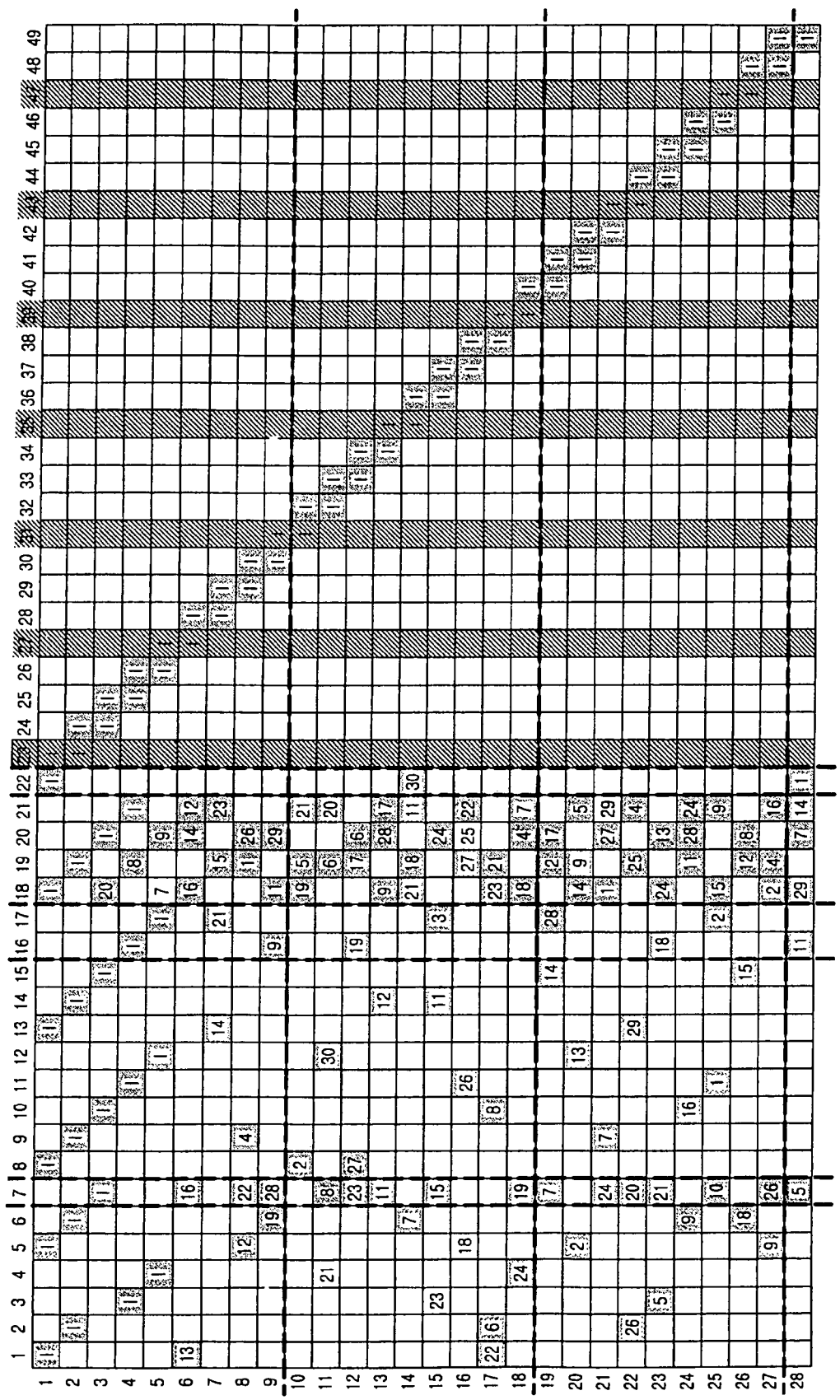
FIG. 16 is a diagram illustrating a parity check matrix of a variable-coding rate block LDPC code according to an embodiment of the present invention.

FIG. 16 is a diagram illustrating a parity check matrix of a variable-coding rate block LDPC code according to an embodiment of the present invention. Referring to FIG. 16, the illustrated parity check matrix includes 49 partial block columns and 28 partial block rows, and an $N_s \times N_s$-sized partial matrix is mapped to each of the partial blocks constituting the parity check matrix. Herein, the "partial matrix" represents a permutation matrix mapped to each of the partial blocks, and the size of the partial block being $N_s$ refers to a square matrix in which the partial matrix has a size of $N_s \times N_s$. It should be noted herein that the size of the partial matrix is expressed by either $N_s \times N_s$ or $N_s$.

A coding rate of the parity check matrix illustrated in FIG. 16 can be expressed as shown in Equation (10).

$$R = \frac{49-28}{49} = \frac{21}{49} = \frac{3}{7} \tag{10}$$

That is, the parity check matrix illustrated in FIG. 16 can be used as a block LDPC code that has a coding rate of 3/7 and a codeword length of $49N_s$, or a parity check matrix of a variable-coding rate block LDPC code can be generated as one parity check matrix using the shortening scheme or the puncturing scheme. For example, a block LDPC code that has a coding rate of 1/3 and a codeword length of $42N_s$ can be generated by shortening a $1^{st}$ partial block column to a $7^{th}$ partial block column using the shortening scheme, mapping partial matrices corresponding to an $8^{th}$ partial block column to a $21^{st}$ partial block column to an information word, and mapping partial matrices correspond to a $22^{nd}$ partial block column to a $49^{th}$ partial block column to a parity.

As another example, a block LDPC code that has a coding rate of 1/2 and a codeword length of $42N_s$ can be generated by mapping partial matrices corresponding to a $1^{st}$ partial block column to a $21^{st}$ partial block column to an information word and puncturing 7 partial block columns among a $22^{nd}$ partial block column to a $49^{th}$ partial block column using the puncturing scheme. In the foregoing examples, it is possible to generate block LDPC codes, which are equal to each other in actual codeword length, but different from each other in coding rate, using the shortening scheme or the puncturing scheme.

The most important factor that should be considered in generating the block LDPC code supporting a variable coding rate is to design such that not only a parent parity check matrix but also a child parity check matrix should be excellent in terms of noise threshold performance. Therefore, a degree distribution is optimized for a parity check matrix of a block LDPC code with a low coding rate, and a parity check matrix of a block LDPC code with a high coding rate is generated such that it includes the optimized parity check matrix and the degree distribution is optimized.

That is, the parity check matrix illustrated in FIG. 16 can be generated by optimizing a degree of distribution for a parity check matrix of a block LDPC code with a coding rate of 1/3, and performing again degree distribution optimization on a parity check matrix of a block LDPC code that includes the optimized parity check matrix and has a coding rate of 3/7. In FIG. 16, for convenience of the design of the parity check matrix, variable node degrees are limited to 4 types, i.e., 2, 3, 5, and 16, and check node degrees are limited to 3 types, i.e., 5, 6, and 7.

In FIG. 16, a noise threshold is $\sigma^*=1.256$ (−0.219 [dB]) for a shortened block LDPC code with a coding rate of 1/3, a noise threshold is $\sigma^*=1.066$ (0.114 [dB]) for a block LDPC code with a coding rate of 3/7, and degree distributions for the block LDPC codes are as follows (Shannon's limit are −0.495 [dB] and −0.122 [dB] for the LDPC codes).

a degree distribution of the shorted block LDPC code with a coding rate of 1/3:
$\lambda_2=0.348$, $\lambda_3=0.174$, $\lambda_5=0.065$, $\lambda_{16}=0.413$;
$\rho_5=0.419$, $\rho_6=0.581$ a degree distribution of the block LDPC code with a coding rate of 3/7:
$\lambda_2=0.280$, $\lambda_3=0.202$, $\lambda_5=0.104$, $\lambda_{16}=0.414$;
$\rho_6=0.093$ The $\lambda_i$ (i=2,3,5,16) is distribution of an edge related to a variable node, which has i degrees, the $\rho_i$ (i=2,3,5,16) is distribution of an edge related to a check node, which has i degrees.

That is, in order to support a variable coding rate, it is necessary to design the block LDPC codes with a lower coding rate and the block LDPC codes with a higher coding rate, such that all of them should have an excellent noise threshold, by setting a result obtained by first performing optimization on the block LDPC code with a low coding rate as one constraint, and then sequentially performing optimization on the block LDPC codes with the next high coding rate. Although the variable node's degrees are limited to 4 types in FIG. 16 for the convenience, if the number of allowed variable node degrees increases, it is possible to acquire a noise threshold having better performance.

A description will now be made of a process of designing a variable-coding rate block LDPC code on the assumption that coding rates are $R_1<R_2<\ldots<R_m$ and a size of each parity check matrix is $M \times N_i$ when the number of check nodes is limited to M and the maximum degree of a variable node is limited to $d_{v,max}$.

Step 1

First, for the coding rate $R_1$, degree distribution optimization is performed using the density evolution scheme. It will be assumed that in the degree of distribution acquired by performing the degree distribution optimization, a ratio of variable nodes having a degree j ($1 \leq j \leq d_{v,max}$) to all of the variable nodes is $f_{1,j}$. The ratio $f_{1,j}$ and a degree of distribution $\lambda_{1,j}$ of an edge are exchangeable using the relation of Equation (11), and the $\lambda_{1,j}$ represents a ratio of energy connected to a variable node with a degree of j to the total energy.

$$f_{1,j} = \frac{\lambda_{1,j}/j}{\sum_k \lambda_{1,k}/k} \Leftrightarrow \lambda_{1,j} = \frac{j \cdot f_{1,j}}{\sum_k k \cdot f_{1,k}} \quad (11)$$

In Equation (11), 'k' has the same value as that of the degree 'j', and the check mode is also considered in the same way as the variable node.

Step 2

The degree distribution optimization is performed by setting an additional constraint that for 1 ($2 \leq l \leq m$), $f_{l-1,j} \times N_{l-1}$ variable nodes with a degree of j among $N_l$ (codeword length of $R_l$) variable nodes are included using the degree distribution acquired from Step 1. The check mode is also performed in the same way as the variable node.

By performing the degree distribution optimization in the way of Step 1 and Step 2, it is possible to design a parity check matrix of a block LDPC code having various coding rates. It can be noted that the designed parity check matrix is a parity check matrix corresponding to a block LDPC code of which a parity length is maintained at M and a block length varies to $N_i$, using the shortening scheme according to a required coding rate $R_i$. In addition, if the puncturing scheme is used together with the shortening scheme, it is possible to generate a block LDPC code having more various coding rates and block (codeword) lengths.

Assuming that for a coding rate $R_i$, the number of punctured parity bits is denoted by $P_i$ (<M), a block length and a coding rate of the generated block LDPC code can be expressed as shown in Equation (12).

$$N_i' = N_i - P_i < N_i, \; R_i' = \frac{N_i - M}{N_i - P_i} > R_i = \frac{N_i - M}{N_i} \quad (12)$$

In order to generate a block LDPC code with a fixed block length, the number $P_i$ of the punctured parity bits is appropriately determined such that $N_i - P_i = N_1$ is maintained. In this case, a coding rate can be expressed as shown in Equation (13).

$$R_i'' = \frac{N_i - M}{N_1} \quad (13)$$

As described above, the most important factor that should be considered in designing a parity check matrix for a variable-coding rate block LDPC code is the degree distribution optimization. If too many coding rates are supported for the variable coding rate, a check node degree increases, deteriorating a cycle characteristic. Therefore, the parity check matrix should be designed considering all of the number of supportable coding rates, a noise threshold to be acquired, and a cycle characteristic.

Figure 8:
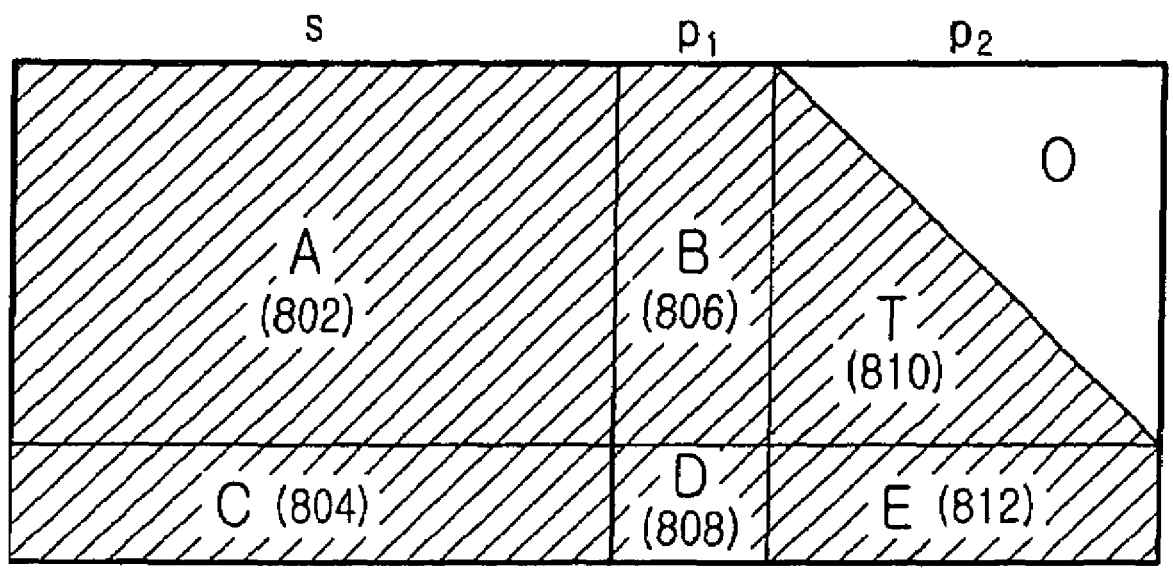
FIG. 8 is a diagram illustrating the parity check matrix of FIG. 7, which is divided into 6 partial blocks.
Figure 10:
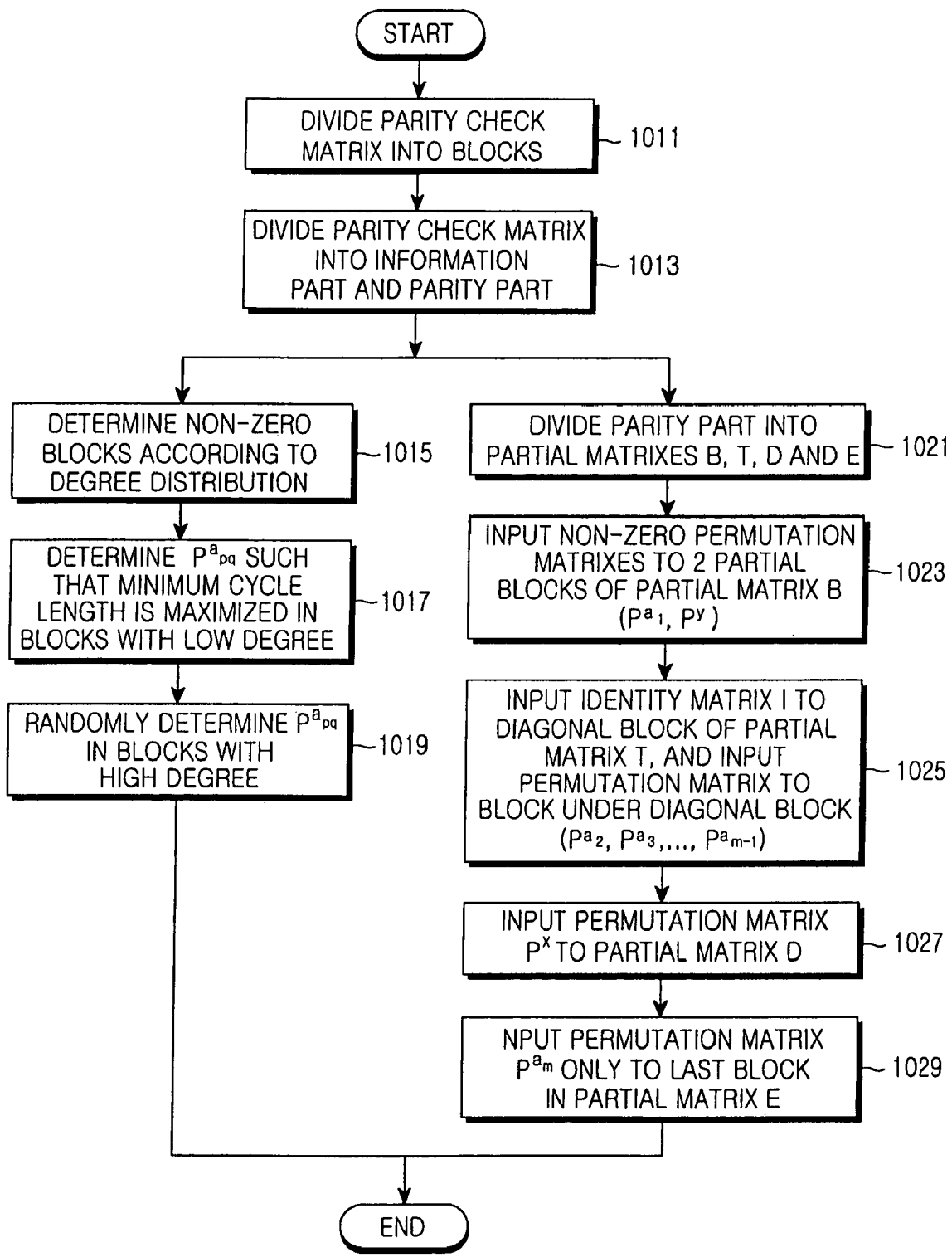
FIG. 10 is a flowchart illustrating a procedure for generating a parity check matrix of a conventional block LDPC code.
Figure 17:
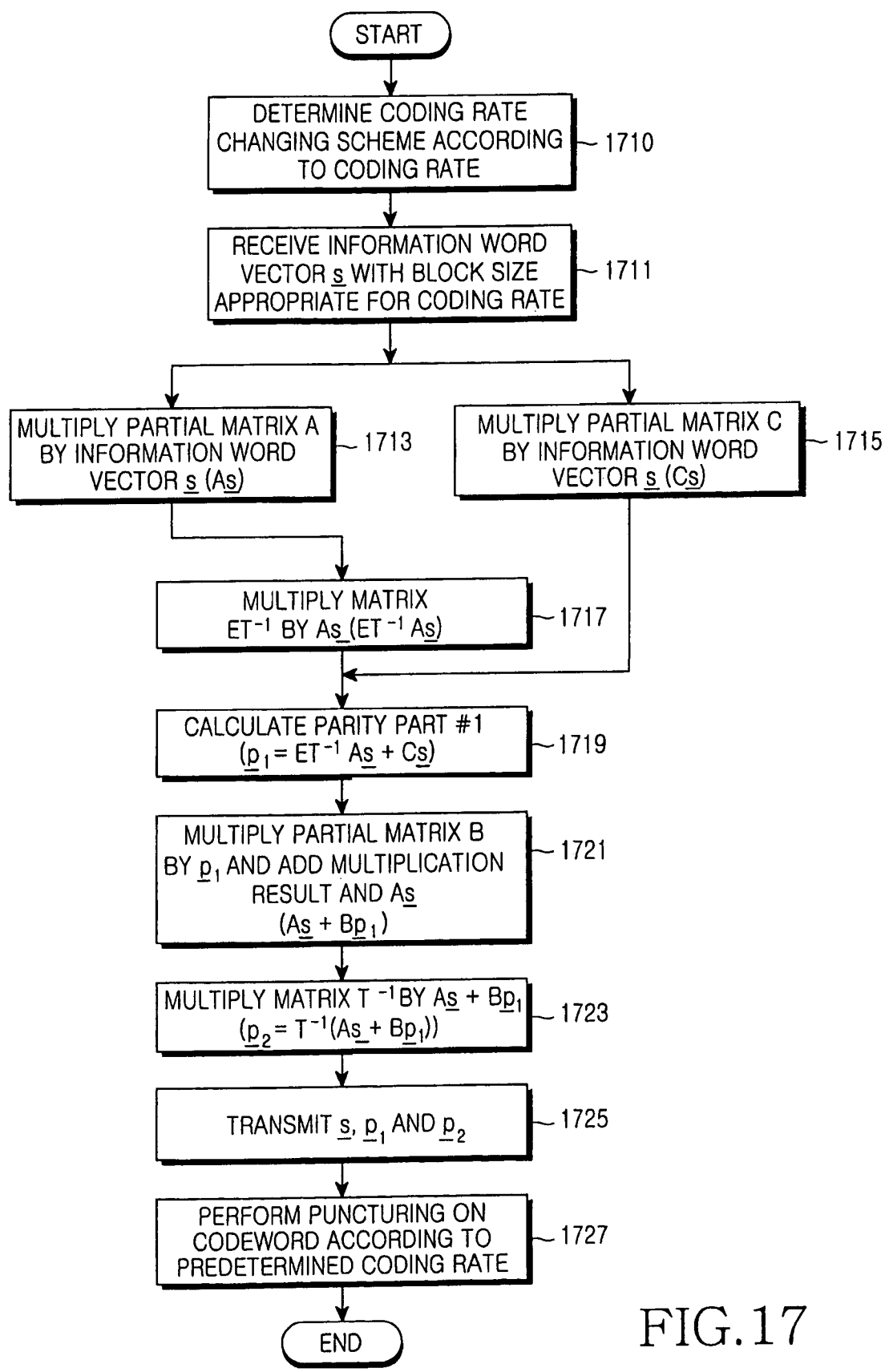
FIG. 17 is a flowchart illustrating a process of coding a variable-coding rate block LDPC code according to an embodiment of the present invention.

FIG. 17 is a flowchart illustrating a process of encoding a variable-coding rate block LDPC code according to an embodiment of the present invention. Before a description of FIG. 17 is given, it will be assumed that a parity check matrix for the variable-coding rate block LDPC code is comprised of 6 partial matrices as described with reference to FIG. 8.

Referring to FIG. 17, in step 1710, a controller determines a coding rate changing scheme to be applied to a parent parity check matrix according to a predetermined coding rate in order to generate the variable-coding rate block LDPC code. Herein, the "coding rate changing scheme" includes the shortening scheme and the puncturing scheme, and when the parent parity check matrix is used as it is, no coding rate changing scheme is used. The coding rate can be changed using either one or both of the shortening scheme and the puncturing scheme. Herein, it will be assumed that the coding rate is changed using the shortening scheme or the puncturing scheme.

In step 1711, the controller receives an information word vector '$\underline{s}$' to be coded into the variable-coding rate block LDPC code. A length of the information word vector '$\underline{s}$' is changed only when the shortening scheme is used. It is assumed herein that a length of the information word vector '$\underline{s}$' received to be coded into the variable-coding rate block LDPC code is 'k'. In step 1713, the controller matrix-multiplies the received information word vector '$\underline{s}$' by a partial matrix A of the parity check matrix ($A\underline{s}$). Herein, because the number of elements having a value of 1 located in the partial matrix A is much less than the number of elements having a value of 0, the matrix multiplication ($A\underline{s}$) of the information word vector s and the partial matrix A of the parity check matrix can be achieved with a relatively small number of sum-product operations.

In addition, in the partial matrix A, because the position where elements having a value of 1 are located can be expressed as exponential multiplication of a position of a non-zero block and a permutation matrix of the block, the matrix multiplication can be performed with a very simple operation as compared with a random parity check matrix.

In step 1715, the controller performs matrix multiplication ($C\underline{s}$) on a partial matrix C of the parity check matrix and the information word vector '$\underline{s}$'. As for the partial matrices A and C used in steps 1713 and 1715, when the shortening scheme is applied to the parent parity check matrix, as many columns of the parent parity check matrix as the shortened part are unused. Therefore, columns corresponding to the shortened part are removed from the partial matrices A and C of the parent parity check matrix.

In step 1717, the controller performs matrix multiplication ($ET^{-1}A\underline{s}$) on the matrix multiplication result ($A\underline{s}$) of the information word vector '$\underline{s}$' and the partial matrix A of the parity check matrix, and a matrix $ET^{-1}$. Herein, because the number of elements having a value of 1 in the matrix $ET^{-1}$ is very small as described above, if an exponent of a permutation matrix of the block is given, the matrix multiplication can be simply performed.

In step 1719, the controller calculates a first parity vector P, by adding the $ET^{-1}A\underline{s}$ and the $C\underline{s}$ ($\underline{P}_1 = ET^{-1}A\underline{s} + C$). Herein, the addition operation is an exclusive OR (XOR) operation, and its result becomes 0 for an operation between bits having the same value and 1 for an operation between bits having different values. That is, the process up to step 1719 is a process for calculating the first parity vector $\underline{P}_1$.

In step 1721, the controller multiplies a partial matrix B of the parity check matrix by the first parity vector $\underline{P}_1$ ($B\underline{P}_1$), adds the multiplication result ($B\underline{P}_1$) to the $A\underline{s}$ ($A\underline{s} + B\underline{P}_1$). If the information word vector '$\underline{s}$' and the first parity vector $\underline{P}_1$ are given, they should be multiplied by an inverse matrix $T^{-1}$ of a partial matrix T of the parity check matrix to calculate a second parity vector $\underline{P}_2$. Therefore, in step 1723, the controller multiplies the calculation result ($A\underline{s}+B\underline{P}_1$) of step 1721 by the inverse matrix $T^{-1}$ of the partial matrix T to calculate the second parity vector $\underline{P}_2$ ($\underline{P}_2 = T^{-1}(A\underline{s}+B\underline{P}_1)$).

As described above, if the information word vector '$\underline{s}$' of a variable-coding rate block LDPC code to be coded is given, the first parity vector $\underline{P}_1$ and the second parity vector $\underline{P}_2$ can be calculated, and as a result, all codeword vectors can be obtained. In step 1725, the controller generates a codeword vector '$\underline{c}$' using the information word vector '$\underline{s}$', the first parity vector $\underline{P}_1$ and the second parity vector $\underline{P}_2$.

In step 1727, the controller generates a block LDPC code corresponding to the coding rate by puncturing a parity of the codeword vector '$\underline{c}$' according to a predetermined puncturing pattern, and then ends the procedure.

Figure 18:
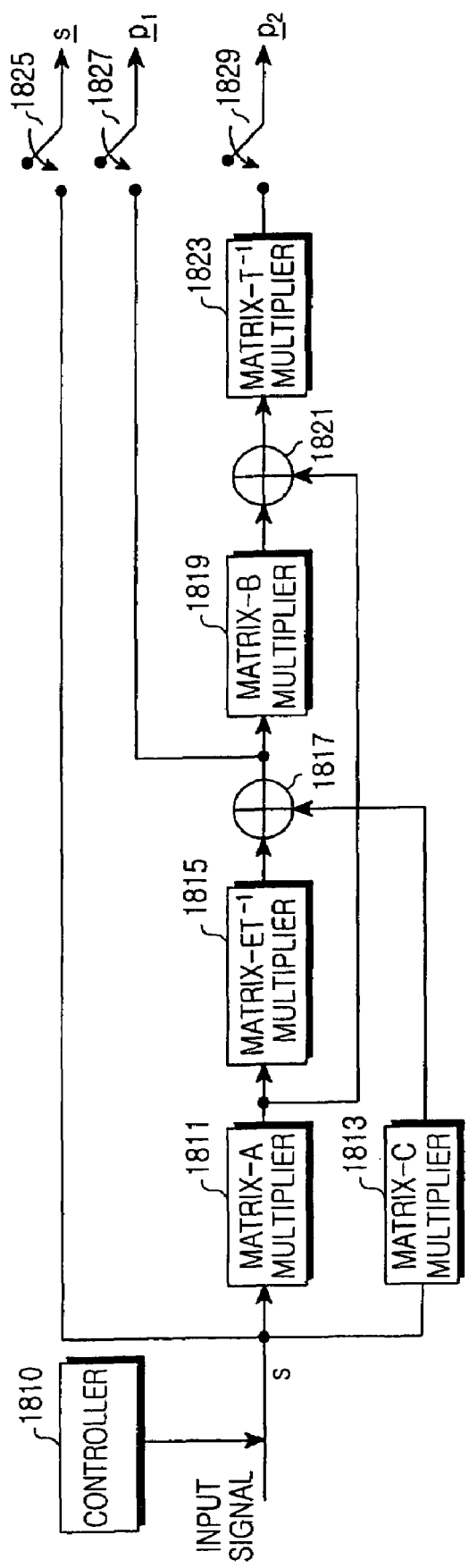
FIG. 18 is a block diagram illustrating an internal structure of an apparatus for coding a variable-coding rate block LDPC code according to an embodiment of the present invention.

FIG. 18 is a block diagram illustrating an internal structure of an apparatus for encoding a variable-coding rate block LDPC code according to an embodiment of the present invention. Referring to FIG. 18, the apparatus for encoding a variable-coding rate block LDPC code includes a controller 1810, a matrix-A multiplier 1811, a matrix-C multiplier 1813, a matrix-$ET^{-1}$ multiplier 1815, an adder 1817, a matrix-B multiplier 1819, an adder 1821, a matrix $T^{-1}$ multiplier 1823, and switches 1825, 1827, and 1829.

An input signal, i.e., a length-k information word vector '$\underline{s}$' to be coded into a variable-coding rate block LDPC code, is input to the switch 1825, the matrix-A multiplier 1811, and the matrix-C multiplier 1813. When the variable-coding rate block LDPC code coding apparatus uses the shortening scheme, the controller 1810 varies a length 'k' of the information word vector '$\underline{s}$' according to a corresponding coding rate and determines a codeword length and a puncturing pattern of the variable-coding rate block LDPC code according to the corresponding coding rate.

The matrix-A multiplier 1811 multiplies the information word vector '$\underline{s}$' by a partial matrix A of the parent parity check matrix, and outputs the multiplication result to the matrix-$ET^{-1}$ multiplier 1815 and the adder 1821. When the shortening scheme is applied to the parent parity check matrix as described with reference to FIG. 17, the matrix A and the matrix C have the format in which columns corresponding to the shorted part are removed from the matrix A and the matrix C of the parent parity check matrix. The matrix-$ET^{-1}$ multiplier 1815 multiplies the signal output from the matrix-A multiplier 1811 by a partial matrix $ET^{-1}$ of the parent parity check matrix, and outputs the multiplication result to the adder 1817.

The adder 1817 adds the signal output from the matrix-$ET^{-1}$ calculator 1815 to the signal output from the matrix-C multiplier 1813, and outputs the addition result to the matrix-B multiplier 1819 and the switch 1827. Herein, the adder 1817 performs the XOR operation on a bit-by-bit basis. For example, if a length-3 vector of $x=(x_1, x_2, x_3)$ and a length-3 vector of $y=(y_1, y_2, y_3)$ are input to the adder 1817, the adder 1817 outputs a length-3 vector of $z=(x_1 \oplus y_1, x_2 \oplus y_2, x_3 \oplus y_3)$ by XORing the length-3 vector of $x=(x_1, x_2, x_3)$ and the length-3 vector of $y=(y_1, y_2, y_3)$. Herein, the $\oplus$ operation represents the XOR operation, a result of which becomes 0 for an operation between bits having the same value, and 1 for an operation between bits having different values. The signal output from the adder 1817 becomes a first parity vector $\underline{P}_1$.

The matrix-B multiplier 1819 multiplies the signal output from the adder 1817, i.e., the first parity vector $\underline{P}_1$, by a partial matrix B of the parent parity check matrix, and outputs the multiplication result to the adder 1821. The adder 1821 adds the signal output from the matrix-B multiplier 1819 to the signal output from the matrix-A multiplier 1811, and outputs the addition result to the matrix-$T^{-1}$ multiplier 1823. The adder 1821, like the adder 1817, performs the XOR operation on the signal output from the matrix-B multiplier 1819 and the signal output from the matrix-A multiplier 1811, and outputs the XOR operation result to the matrix-$T^{-1}$ multiplier 1823.

The matrix-$T^{-1}$ multiplier 1823 multiplies the signal output from the adder 1821 by an inverse matrix $T^{-1}$ of a partial matrix T of the parent parity check matrix, and outputs the multiplication result to the switch 1829. The output of the matrix-$T^{-1}$ multiplier 1823 becomes a second parity vector $\underline{P}_2$. Each of the switches 1825, 1827, and 1829 is switched on only at its transmission time to transmit its associated signal. The switch 1825 is switched on at a transmission time of the information word vector '$\underline{s}$', the switch 1827 is switched on at a transmission time of the first parity vector $\underline{P}_1$, and the switch 1829 is switched on at a transmission time of the second parity vector $\underline{P}_2$. When the puncturing scheme is applied to the parent parity check matrix, the controller 1810 controls the switch 1627 and the switch 1629 to puncture the parity according to the corresponding coding rate.

Although it will be described in detail below, because the embodiments of the present invention should be able to generate a variable-coding rate block LDPC code, each of the matrices used in the variable-coding rate block LDPC code encoding apparatus of FIG. 18 is changed each time a parity check matrix of the variable-coding rate block LDPC code is changed. Therefore, although not separately illustrated in FIG. 18, the controller 1810 modifies the matrices used in the encoding apparatus for the variable-coding rate block LDPC code when the parity check matrix of the variable-coding rate block LDPC code changes.

All of the LDPC-family codes can be decoded in a factor graph using a sub-product algorithm. A decoding scheme of the LDPC code can be roughly divided into a bi-directional transfer scheme and a flow transfer scheme. When a decoding operation is performed using the bi-directional transfer scheme, each check node has a node processor, increasing decoding complexity in proportion to the number of the check nodes. However, because all of the check nodes are simultaneously updated, the decoding speed increases remarkably. Conversely, the flow transfer scheme has a single node processor, and the node processor updates information, passing through all of the nodes in a factor graph. Therefore, the flow transfer scheme is lower in decoding complexity, but an increase in size of the parity check matrix, i.e., an increase in number of nodes, decreases the decoding speed.

However, if a parity check matrix is generated per block like the variable-coding rate block LDPC code having various coding rates, proposed in the present invention, then as many node processors as the number of blocks constituting the parity check matrix are used. In this case, it is possible to implement a decoder, which is lower than the bi-directional transfer scheme in the decoding complexity and higher than the flow transfer scheme in the decoding speed.

Figure 19:
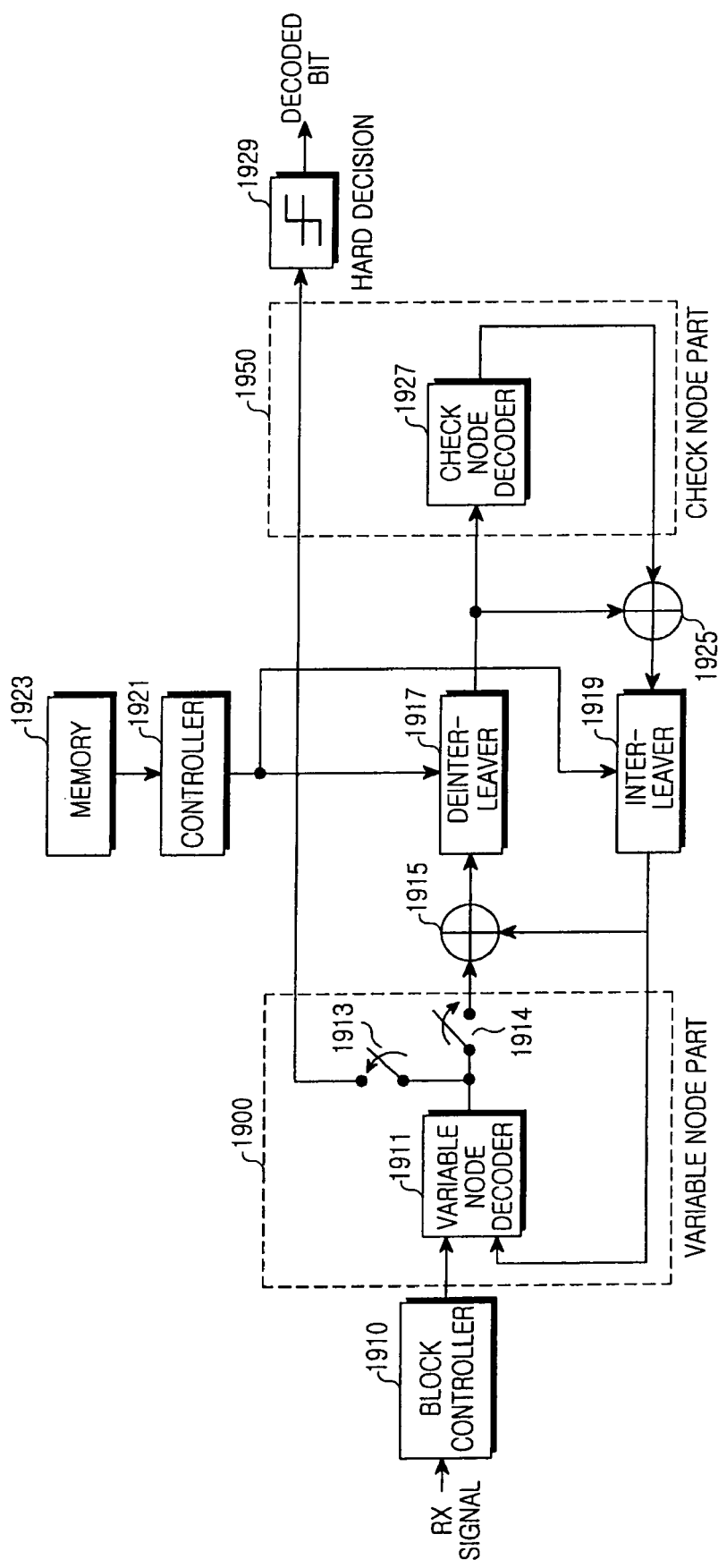
FIG. 19 is a block diagram illustrating an internal structure of an apparatus for decoding a variable-coding rate block LDPC code according to embodiments of the present invention.

FIG. 19 is a block diagram illustrating an internal structure of an apparatus for decoding a variable-coding rate block LDPC code according to embodiments of the present invention. Referring to FIG. 19, the decoding apparatus for decoding a variable-coding rate block LDPC code includes a block controller 1910, a variable node part 1900, an adder 1915, a deinterleaver 1917, an interleaver 1919, a controller 1921, a memory 1923, an adder 1925, a check node part 1950, and a hard decider 1929. The variable node part 1900 includes a variable node decoder 1911 and switches 1913 and 1914, and the check node part 1950 includes a check node decoder 1927.

A signal received over a radio channel is input to the block controller 1910. The block controller 1910 determines a block size of the received signal. If there is an information word part punctured in a coding apparatus corresponding to the decoding apparatus, the block controller 1910 inserts '0' into the punctured information word part, to adjust the full block size, and outputs the resultant signal to the variable node decoder 1911. The block controller 1910 has previously stored information on a method of applying the shortening scheme and the puncturing scheme to a parent parity check matrix according to a corresponding coding rate, predefined between the decoding apparatus and its associated coding apparatus. Herein, the information on the method of applying the shortening scheme and the puncturing scheme to a parent parity check matrix according to a corresponding coding rate includes information on the number of shortened or punctured partial blocks and information on the positions of the shortened or punctured partial blocks. Therefore, the block controller 1910 removes the parts shortened according to the coding rate applied in the coding apparatus, from the receiving signal, inserts an LLR value '0' into the punctured parts, and outputs the resultant signals to the variable node decoder 1911.

The variable node decoder 1911 calculates probability values of the signal output from the block controller 1910, updates the calculated probability values, and outputs the updated probability values to the switches 1913 and 1914. The variable node decoder 1911 connects the variable nodes according to a parity check matrix previously set in the decoding apparatus for a variable-coding rate block LDPC code, and performs an update operation on as many input values and output values as the number of 1s connected to the variable nodes. The number of is connected to the variable nodes is equal to a weight of each of the columns included in the parity check matrix. An internal operation of the variable node decoder 1911 differs according to a weight of each of the columns included in the parity check matrix. However, when the switch 1913 is switched on, the switch 1914 is switched on to output the output signal of the variable node decoder 1911 to the adder 1915.

The adder 1915 receives a signal output from the variable node decoder 1911 and an output signal of the interleaver 1919 in a previous iterative decoding process, subtracts the output signal of the interleaver 1919 in the previous iterative decoding process from the output signal of the variable node decoder 1911, and outputs the subtraction result to the deinterleaver 1917. If the decoding process is an initial decoding process, it should be regarded that the output signal of the interleaver 1919 is 0.

The deinterleaver 1917 deinterleaves the signal output from the adder 1915 according to a predetermined interleaving scheme, and outputs the deinterleaved signal to the adder 1925 and the check node decoder 1927. The deinterleaver 1917 has an internal structure corresponding to the parity check matrix because an output value for an input value of the interleaver 1919 corresponding to the deinterleaver 1917 is different according to a position of elements having a value of 1 in the parity check matrix.

The adder 1925 receives an output signal of the check node decoder 1927 in a previous iterative decoding process and an output signal of the deinterleaver 1917, subtracts the output signal of the deinterleaver 1917 from the output signal of the check node decoder 1927 in the previous iterative decoding process, and outputs the subtraction result to the interleaver 1919. The check node decoder 1927 connects the check nodes according to a parity check matrix previously set in the decoding apparatus for the block LDPC code, and performs an update operation on a number of input values and output values equal to the number of 1s connected to the check nodes. The number of 1s connected to the check nodes is equal to a weight of each of rows constituting the parity check matrix. Therefore, an internal operation of the check node decoder 1927 is different according to a weight of each of the rows constituting the parity check matrix.

The interleaver 1919, under the control of the controller 1921, interleaves the signal output from the adder 1925 according to a predetermined interleaving scheme, and outputs the interleaved signal to the adder 1915 and the variable node decoder 1911. The controller 1921 reads the interleaving scheme-related information previously stored in the memory 1923, and controls an interleaving scheme of the interleaver 1919 and a deinterleaving scheme of the deinterleaver 1917 according to the read interleaving scheme information. Similarly, if the decoding process is an initial decoding process, it should be regarded that the output signal of the deinterleaver 1917 is 0.

By iteratively performing the foregoing processes, the decoding apparatus performs error-free reliable decoding. After the iterative decoding is performed a predetermined number of times, the switch 1914 switches off a connection between the variable node decoder 1911 and the adder 1915, and the switch 1913 switches on a connection between the variable node decoder 1911 and the hard decider 1929 to provide the signal output from the variable node decoder 1911 to the hard decider 1929. The hard decider 1929 performs a hard decision on the signal output from the variable node decoder 1911, and outputs the hard decision result, and the output value of the hard decider 1929 becomes a finally decoded value.

Figure 20:
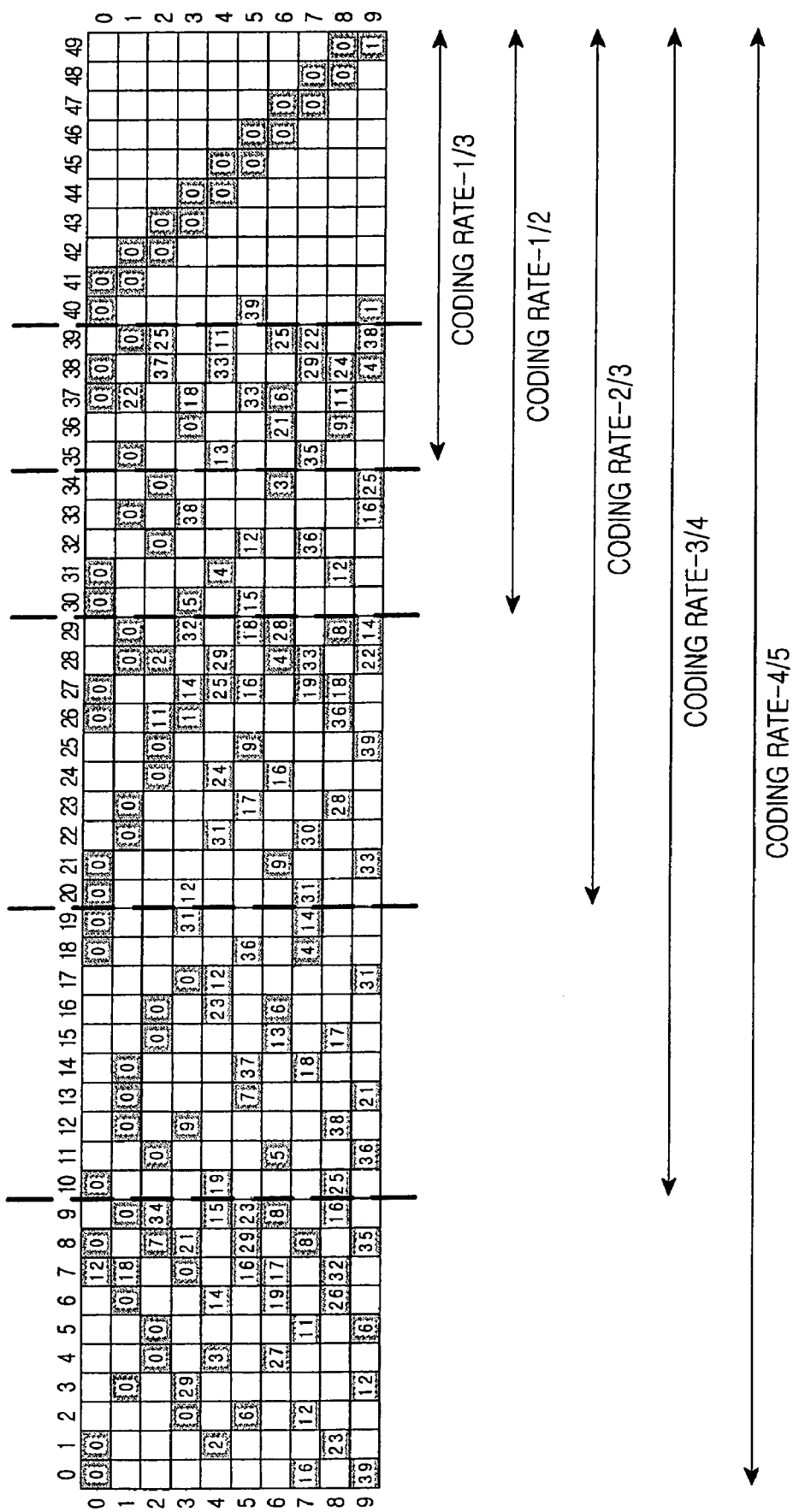
FIG. 20 is a diagram illustrating a parity check matrix for a variable-coding rate block LDPC code according to an embodiment of the present invention.

FIG. 20 is a diagram illustrating a parity check matrix for a variable-coding rate block LDPC code according to an embodiment of the present invention. More specifically, FIG. 20 illustrates a parity check matrix for a block LDPC code having a codeword length of 2000 and a coding rate of 4/5. Herein, a size of each block in the parity check matrix is 40×40, and a value written in each of the blocks, i.e., partial blocks, illustrated in FIG. 20 represents an exponent of a permutation matrix.

As illustrated in FIG. 20, an information part mapped to an information word of the parity check matrix is divided into 4 subparts and only the codeword mapped to the part corresponding to the part denoted by an arrow according to a corresponding coding rate is transmitted, thereby making it possible to support coding rates of 1/3, 1/2, 2/3, 3/4 and 4/5. A codeword (N,K) for each of the coding rates of 1/3, 1/2, 2/3, 3/4 and 4/5 is expressed as follows.

(N,K)=(600,200), (800,400), (1200,800), (1600,1200), (2000,1600)

Figure 21:
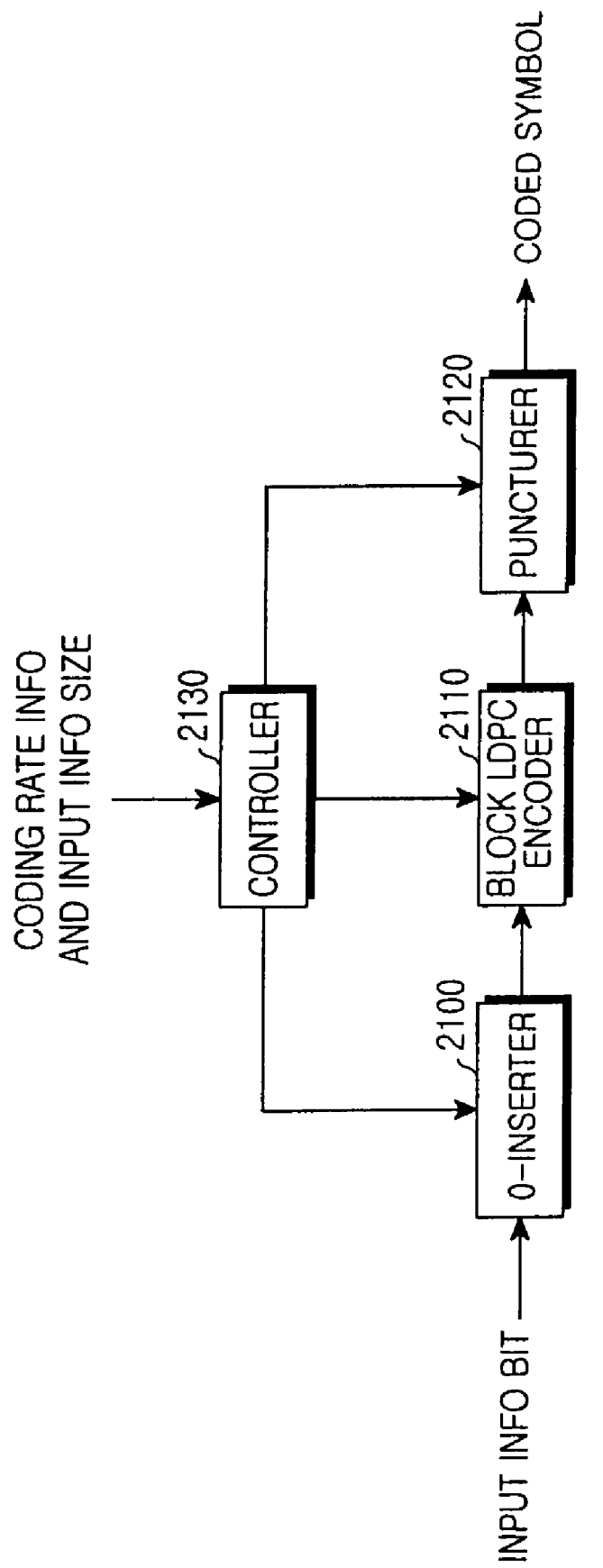
FIG. 21 is a diagram illustrating an internal structure of a coding apparatus for a variable-coding rate block LDPC code according to another embodiment of the present invention.

FIG. 21 is a diagram illustrating an internal structure of a encoding apparatus for a variable-coding rate block LDPC code according to another embodiment of the present invention. Referring to FIG. 21, the encoding apparatus for a variable-coding rate block LDPC code includes a 0-inserter 2100, a block LDPC encoder 2110, a puncturer 2120, and a controller 2130. The encoding apparatus for a variable-coding rate block LDPC code, illustrated in FIG. 21, has a structure capable of using the conventional variable-coding rate block LDPC encoding apparatus without any modification, by simply adding the 0-inserter 2100 to the variable-coding rate block LDPC coding apparatus that uses the parent parity check matrix as it is when the shortening scheme is used. Accordingly, the encoding apparatus for a variable-coding rate block LDPC code, illustrated in FIG. 21, can reduce its hardware complexity by simply including the 0-inserter 2100.

Before an input information bit stream is input to the coding apparatus for a variable-coding rate block LDPC code, information on a corresponding coding rate and a size of the input information bit stream is delivered to the controller 2130. Then the controller 2130 outputs the information on the coding rate to the 0-inserter 2100 and the puncturer 2120, and outputs codeword length information based on the size information of the input information bit stream to the block LDPC encoder 2110. Thereafter, the input information bit stream is input to the 0-inserter 2100.

The 0-inserter 2100 inserts '0' into the input information bit stream according to the coding rate information output from the controller 2130, and outputs the 0-inserted input information bit stream to the block LDPC encoder 2110. A size of the information word output from the 0-inserter 2100 is equal to a size (1600 bits) of the information word in the parity check matrix illustrated in FIG. 20.

It will be assumed herein that the block LDPC encoder 2110 receives a (2000,1600) code, i.e., a 1600-bit input information bit stream, and outputs 2000 coded symbols. If the block LDPC encoder 2110 operates as a (1600,1200) block LDPC encoder with a coding rate of 3/4, the 0-inserter 2100 receives a 1200-bit input information bit stream, inserts 400 '0'-bits into the 1200-bit input information bit stream, and outputs a total of 1600 bits. If the block LDPC encoder 2110 operates as a (1200,800) block LDPC encoder with a coding rate of 2/3, the 0-inserter 2100 receives a 800-bit input information bit stream, inserts 800 '0'-bits into the 800-bit input information bit stream, and outputs a total of 1600 bits. If the block LDPC encoder 2110 operates as a (800,400) block LDPC encoder with a coding rate of 1/2, the 0-inserter 2100 receives a 400-bit input information bit stream, inserts 1200 '0'-bits into the 400-bit input information bit stream, and outputs a total of 1600 bits. If the block LDPC encoder 2110 operates as a (600,200) block LDPC encoder with a coding rate of 3/4, the 0-inserter 2100 receives a 200-bit input information bit stream, inserts 1400 '0'-bits into the 200-bit input information bit stream, and outputs a total of 1600 bits.

The 1600-bit stream output from the 0-inserter 2100 is input to the block LDPC encoder 2110, and the block LDPC encoder 2110 performs (2000,1600) block LDPC coding on the 1600-bit stream. The block LDPC encoder 2100 codes the 1600-bit stream output from the 0-inserter 2100 according to the parity check matrix described with reference to FIG. 20, and outputs 2000 coded symbols. The 2000 coded symbols output from the block LDPC encoder 2110 are input to the puncturer 2120, and the puncturer 2120 punctures as many coded symbols as the number corresponding to the coding rate information provided from the controller 2130, among the 2000 symbols.

For example, if the coding apparatus operates as a (1600, 1200) coding apparatus with a coding rate of 3/4, the puncturer 2120 receives 2000 coded symbols, punctures 400 coded symbols therefrom, and outputs a total of 1600 coded symbols. If the coding apparatus operates as a (1200,800) coding apparatus with a coding rate of 2/3, the puncturer 2120 receives 2000 coded symbols, punctures 800 coded symbols therefrom, and outputs a total of 1200 coded symbols. If the coding apparatus operates as a (800,400) coding apparatus with a coding rate of 1/2, the puncturer 2120 receives 2000 coded symbols, punctures 1200 coded symbols therefrom, and outputs a total of 800 coded symbols. If the coding apparatus operates as a (600,200) coding apparatus with a coding rate of 1/3, the puncturer 2120 receives 2000 coded symbols, punctures 1400 coded symbols therefrom, and outputs a total of 600 coded symbols.

Figure 22:
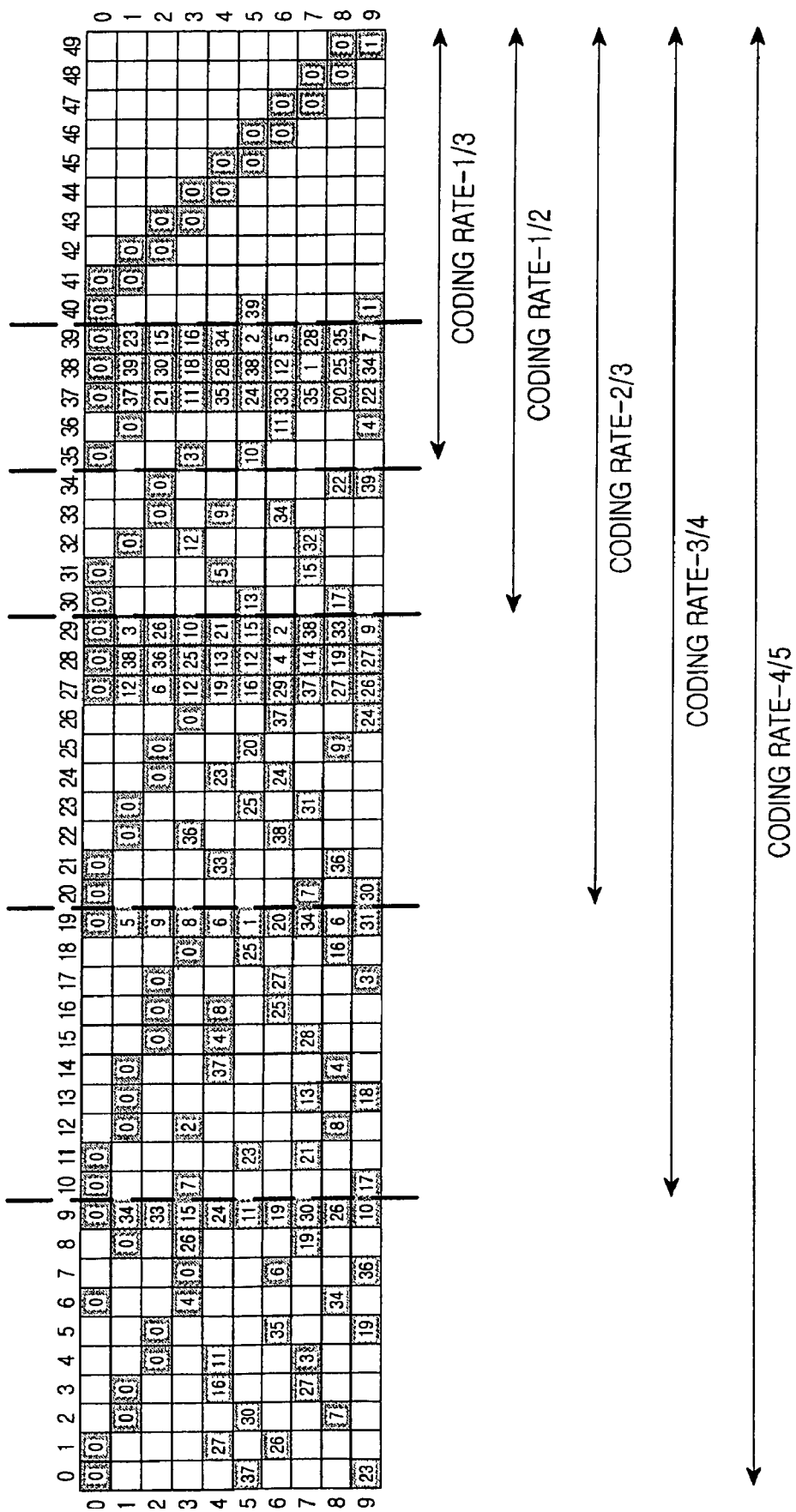
FIG. 22 is a diagram illustrating a parity check matrix for a variable-coding rate block LDPC code according to an embodiment of the present invention.

FIG. 22 is a diagram illustrating a parity check matrix for a variable-coding rate block LDPC code according to an embodiment of the present invention. More specifically, FIG. 22 illustrates a parity check matrix for a block LDPC code having a codeword length of 2000 and a coding rate of 4/5. Herein, a size of each block in the parity check matrix is 40×40, and a value written in each of the blocks, i.e., partial blocks, illustrated in FIG. 22 represents an exponent of a permutation matrix.

Referring to FIG. 22, an information part mapped to an information word of the parity check matrix is divided into 4 subparts and only the codeword mapped to the part corresponding to the part denoted by an arrow according to a corresponding coding rate is transmitted, thereby making it possible to support coding rates of 1/3, 1/2, 2/3, 3/4, and 4/5. A difference between the parity check matrix illustrated in FIG. 22 and the parity check matrix illustrated in FIG. 20 is in that they have different matrix distributions. In particular, the parity check matrix illustrated in FIG. 22 has a structure in which a mean row weight is 19.7 and a girth, which is a number of the minimum cycle, is 6. A codeword (N,K) for each of the coding rates of 1/3, 1/2, 2/3, 3/4 and 4/5 is expressed as follows.

(N,K)=(600,200), (800,400), (1200,800), (1600,1200), (2000,1600)

Figure 23:
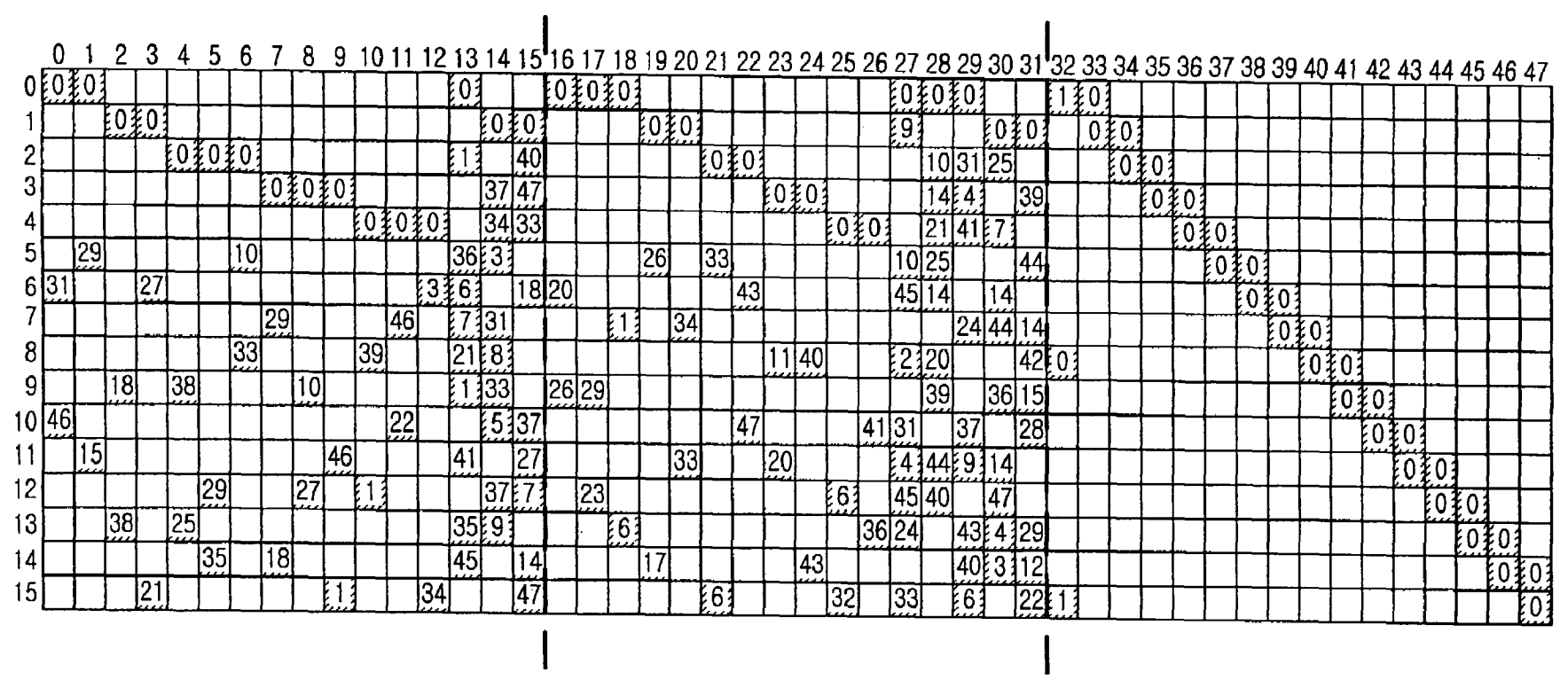

FIG. 23 is a diagram illustrating a parity check matrix for a variable-coding rate block LDPC code according to an embodiment of the present invention. More specifically, FIG. 23 illustrates a parity check matrix supporting a coding rate of 2/3. A block LDPC code with a coding rate of 1/2 can be generated by shortening a part segmented by a first line in the parity check matrix using the shortening scheme.

Figure 24:
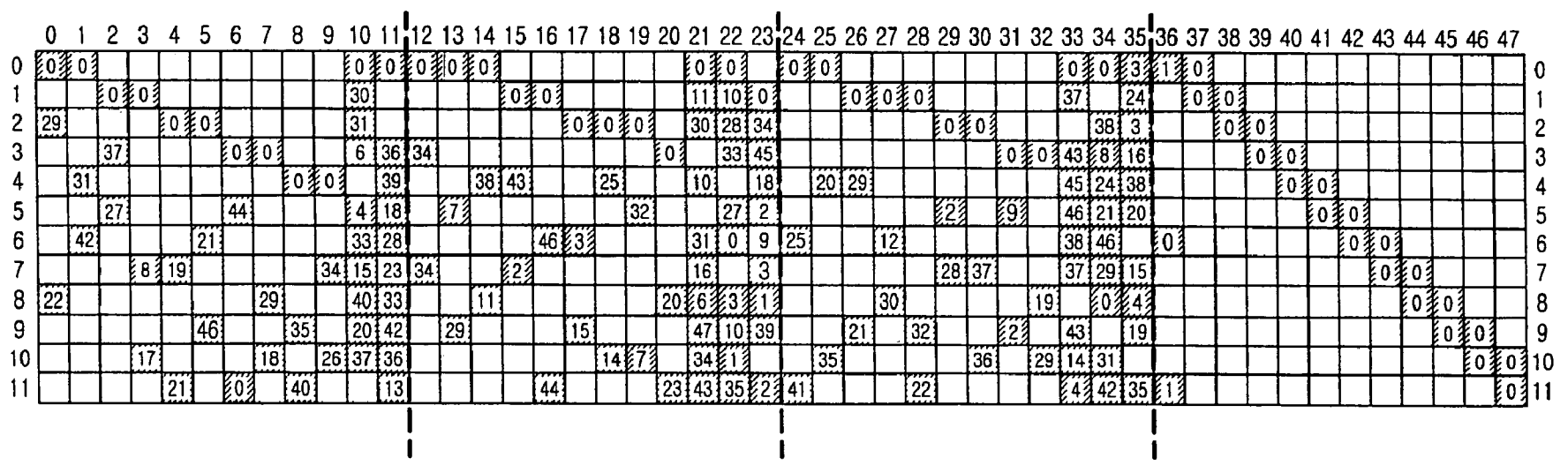

FIG. 24 is a diagram illustrating a parity check matrix for a variable-coding rate block LDPC code according to an embodiment of the present invention. More specifically, FIG. 24 illustrates a parity check matrix supporting a coding rate of 3/4. A block LDPC code with a coding rate of 2/3 can be generated by shortening a part segmented by a first line in the parity check matrix using the shortening scheme, and a block LDPC code with a coding rate of 1/2 can be generated by shortening a part segmented by a second line in the parity check matrix using the shortening scheme.

Figure 25:
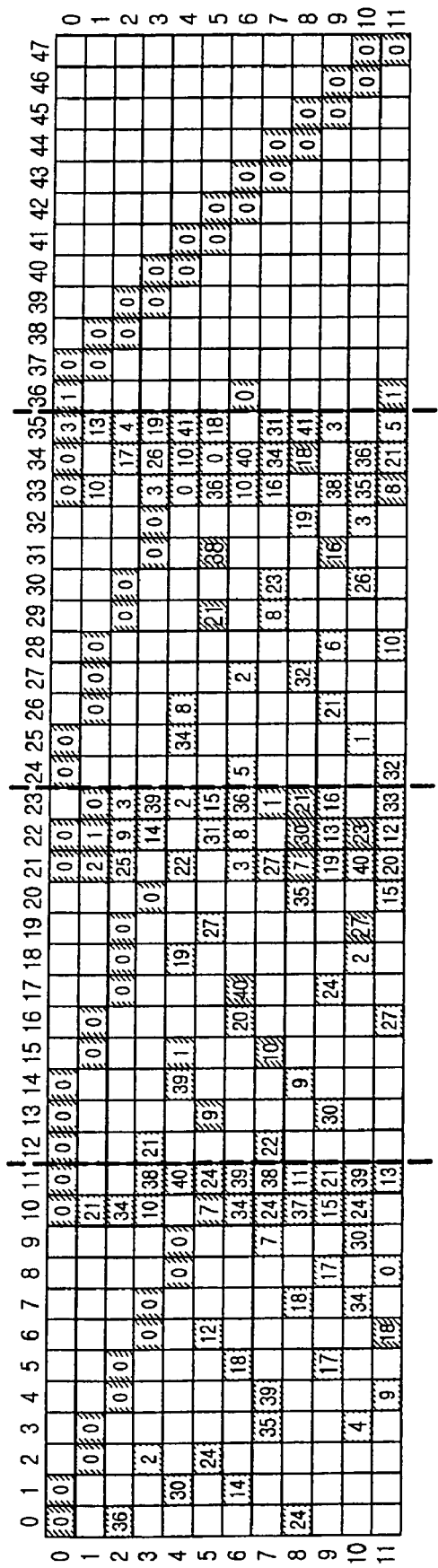
FIG. 25 is a diagram illustrating a parity check matrix for a variable-coding rate block LDPC code according to an embodiment of the present invention.

FIG. 25 is a diagram illustrating a parity check matrix for a variable-coding rate block LDPC code according to an embodiment of the present invention. More specifically, FIG. 25 illustrates a parity check matrix supporting a coding rate of 3/4. A block LDPC code with a coding rate of 2/3 can be generated by shortening a part segmented by a first line in the parity check matrix using the shortening scheme, and a block LDPC code with a coding rate of 1/2 can be generated by shortening a part segmented by a second line in the parity check matrix using the shortening scheme.

As described above, the present invention proposes a variable-coding rate block LDPC code in a mobile communication system, thereby improving flexibility of the block LDPC code. In addition, the present invention generates an efficient parity check matrix, thereby minimizing coding complexity of a variable-coding rate block LDPC code. In particular, the present invention enables generation of a block LDPC code capable of supporting various coding rates, thereby minimizing hardware complexity.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for encoding a block Low Density Parity Check (LDPC) code having a variable coding rate, the method comprising the steps of:
    receiving an information word; and
    determining one of the first parity check matrix and the second parity check matrix according to the variable coding rate;
    generating a first signal by multiplying the information word by a first partial matrix of the determined parity check matrix;
    generating a second signal by multiplying the information word by a second partial matrix of the determined parity check matrix;
    generating a third signal by multiplying the first signal by a matrix multiplication of a third partial matrix and an inverse matrix of a fourth partial matrix of the determined parity check matix;
    generating a fourth signal by adding the second signal to the third signal;
    generating a fifth signal by multiplying the fourth signal by a fifth partial matrix of the determined parity check matrix;
    generating a sixth signal by adding the second signal to the fifth signal;

generating a seventh signal by multiplying the sixth signal by the inverse matrix of the fourth matrix of the determined parity check matrix; and multiplexing the information word, the fourth signal defined as a first parity word, and the seventh signal defined as a second parity word, such that the information word, the first parity word and the second parity word are mapped to the block LDPC code, wherein each of the first parity check matrix and the second parity check matrix includes a plurality of partial blocks, the first parity check matrix includes an information part mapped to an information word and a parity part mapped to a parity word, a first number of partial blocks among the plurality of partial blocks in the first parity check matrix are mapped to the information part, and a second number of partial blocks, excluding the first number of partial blocks, among the plurality of partial blocks in the first parity check matrix are mapped to the parity part, and the second parity check matrix is obtained by shortening a predetermined number of partial blocks among the first number of partial blocks in the first parity check matrix.

2. The method of claim 1, wherein a predetermined permutation matrix is mapped to each of predetermined partial blocks among the partial blocks on a one-to-one basis.

3. The method of claim 1, wherein the first partial matrix and the second partial matrix are partial matrices mapped to an information part associated with an information word in the determined parity check matrix.

4. The method of claim 3, wherein the third partial matrix and the fourth partial matrix are partial matrices mapped to a first parity part associated with a parity word, and the fifth partial matrix and the sixth partial matrix are partial matrices mapped to a second parity part associated with the parity word.

5. The method of claim 1, wherein the step of determining one of the first parity check matrix and the second parity check matrix according to the coding rate comprises the step of:

if the second parity check matrix is determined to be used according to the coding rate, generating the second parity check matrix by applying one of a shortening scheme and a puncturing scheme to the first parity check matrix.

6. The method of claim 5, wherein the second parity check matrix is a parity check matrix obtained by puncturing a predetermined number of partial blocks among the second number of partial blocks in the first parity check matrix using the puncturing scheme.

7. The method of claim 6, wherein when the coding rate is 3/7 and a codeword length of the block LDPC code is $49N_s$, the first parity check matrix is expressed as:

-continued where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

8. The method of claim 7, wherein when the coding rate is 1/2 and the codeword length of the block LDPC code is $42N_s$, the second parity check matrix is generated by mapping partial matrices corresponding to a $1^{st}$ partial block column to a $21^{st}$ partial block column of the first parity check matrix, to the information word, and puncturing 7 predetermined partial block columns among a $22^{nd}$ partial block column to a $49^{th}$ partial block column using the puncturing scheme.

9. The method of claim 8, wherein the first parity check matrix and the second parity check matrix are parity check matrices of which degree of distributions are optimized.

10. The method of claim 9, wherein the punctured partial block columns include a $23^{rd}$ partial block column, a $27^{th}$ partial block column, a $31^{st}$ partial block column, a $35^{th}$ partial block column, a $39^{th}$ partial block column, a $43^{rd}$ partial block column, and a $47^{th}$ partial block column in the first parity check matrix.

11. The method of claim 5, wherein the second parity check matrix is obtained by shortening a predetermined number of partial blocks among the first number of partial blocks in the first parity check matrix using the shortening scheme.

12. The method of claim 11, wherein when the coding rate is 3/7 and a codeword length of the block LDPC code is $49N_s$, the first parity check matrix is expressed as:

[matrix continuation showing rows 19-28 with 1s on diagonal in right portion]

where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

13. The method of claim 12, wherein when the coding rate is 1/3 and the codeword length of the block LDPC code is $42N_s$, the second parity check matrix is generated by shortening a $1^{st}$ partial block column to a $7^{th}$ partial block column of the first parity check matrix using the shortening scheme, mapping partial matrices corresponding to an $8^{th}$ partial block column to a $21^{st}$ partial block column to the information word, and mapping partial matrices corresponding to a $22^{nd}$ partial block column to a $49^{th}$ partial block column to the parity.

14. The method of claim 13, wherein the first parity check matrix and the second parity check matrix are parity check matrices of which degree of distributions are optimized.

15. The method of claim 11, wherein when the coding rate is 4/5 and a codeword length of the block LDPC code is $50N_s$, the first parity check matrix is expressed as:

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|----|----|----|----|----|----|----|----|----|----|----|----|----|----|----|----|----|----|----|----|
| 0 | 0 | 0 |   |   |   |   |   | 12 | 0 |   | 0 |   |   |   |   |   | 0 | 0 | 0 | 0 |   |   |   |   |   | 0 | 0 |   |   |   |
| 1 |   |   |   | 0 |   |   | 0 | 18 |   | 0 |   |   | 0 | 0 | 0 |   |   |   |   |   | 0 | 0 |   |   |   |   |   | 0 | 0 |   |
| 2 |   |   | 0 | 0 |   |   |   | 7 | 34 |   | 0 |   |   |   | 0 | 0 |   |   |   |   |   |   | 0 | 0 | 11 |   | 2 |   |   |   |
| 3 |   | 0 | 29 |   |   |   | 0 | 21 |   |   |   |   | 9 |   |   |   |   | 0 | 31 | 12 |   |   |   |   | 1 | 14 |   | 32 |   |   |
| 4 | 2 |   |   |   | 14 |   |   |   | 15 | 19 |   |   |   | 23 | 12 |   |   |   | 31 |   | 24 |   |   | 25 | 29 |   |   |   |   |   |
| 5 |   | 6 |   |   |   | 16 | 29 | 23 |   |   | 7 | 37 |   |   |   | 36 |   |   |   | 17 |   | 9 |   | 16 |   | 18 |   |   |   |   |
| 6 |   |   | 27 |   | 19 | 17 |   | 8 |   | 5 |   |   | 13 | 6 |   |   |   | 9 |   | 16 |   |   |   |   | 4 | 28 |   |   |   |   |
| 7 | 16 |   | 12 |   |   | 11 |   | 8 |   |   |   | 18 |   |   | 4 | 14 | 31 |   | 30 |   |   |   |   | 19 | 33 |   |   |   |   |   |
| 8 |   | 23 |   |   |   | 26 | 32 |   | 16 | 25 |   | 38 |   | 17 |   |   |   |   | 28 |   |   |   | 36 | 18 |   | 8 |   |   |   |   |
| 9 | 39 |   | 12 |   | 6 |   |   | 35 |   |   | 36 |   | 21 |   |   | 31 |   |   | 33 |   |   | 39 |   |   | 22 | 14 |   |   |   |   |

| | 30 | 31 | 32 | 33 | 34 | 35 | 36 | 37 | 38 | 39 | 40 | 41 | 42 | 43 | 44 | 45 | 46 | 47 | 48 | 49 | |
|---|----|----|----|----|----|----|----|----|----|----|----|----|----|----|----|----|----|----|----|----|---|
| | 0 | 0 |   |   |   |   | 0 | 0 |   | 0 | 0 |   |   |   |   |   |   |   |   | 0 | 0 |
| | | | 0 |   | 0 |   | 22 |   | 0 |   | 0 | 0 |   |   |   |   |   |   |   | | 1 |
| | | | 0 | | 0 | | | 37 | 25 | | | 0 | 0 | | | | | | | | 2 |
| | 5 | | | 38 | | | 0 | 18 | | | | | 0 | 0 | | | | | | | 3 |
| | | 4 | | | | 13 | | | 33 | 11 | | | | 0 | 0 | | | | | | 4 |
| | 15 | | 12 | | | | | 33 | | | 39 | | | | 0 | 0 | | | | | 5 |
| | | | | 3 | | 21 | 6 | | 25 | | | | | | | 0 | 0 | | | | 6 |
| | | 36 | | | 35 | | | 29 | 22 | | | | | | | | 0 | 0 | | | 7 |
| | 12 | | | | | | 9 | 11 | 24 | | | | | | | | | 0 | 0 | | 8 |
| | | | 16 | 25 | | | 4 | 38 | 1 | | | | | | | | | | 1 | 9 | where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

16. The method of claim 15, wherein when the coding rate is 1/3 and the codeword length of the block LDPC code is $15N_s$, the second parity check matrix is generated by shortening a $0^{th}$ partial block column to a $34^{th}$ partial block column of the first parity check matrix using the shortening scheme, mapping partial matrices corresponding to a $35^{th}$ partial block column to a $39^{th}$ partial block column to the information word, and mapping partial matrices corresponding to a $40^{th}$ partial block column to a $49^{th}$ partial block column to the parity;

block column to a $39^{th}$ partial block column to the information word, and mapping partial matrices corresponding to a $40^{th}$ partial block column to a $49^{th}$ partial block column to the parity;

wherein when the coding rate is 3/4 and the codeword length of the block LDPC code is $40N_s$, the second parity check matrix is generated by shortening a $0^{th}$ partial block column to a $9^{th}$ partial block column of the first parity check matrix using the shortening scheme, mapping partial matrices corresponding to a $10^{th}$ partial block column to a $39^{th}$ partial block column to the information word, and mapping partial matrices corresponding to a $40^{th}$ partial block column to a $49^{th}$ partial block column to the parity.

17. The method of claim 11, wherein when the coding rate is 4/5 and a codeword length of the block LDPC code is $50N_s$, the first parity check matrix is expressed as:

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|---|---|---|---|---|---|---|---|---|---|---|---|---|---|---|
| 0 | 0 | 0 | | | | | 0 | | | 0 | 0 | 0 | | | | | | | | | 0 | 0 | 0 | | | | | 0 | 0 | 0 |
| 1 | | | 0 | 0 | | | | | 0 | 34 | | 0 | 0 | 0 | | | | | | | 5 | | | 0 | 0 | | | 12 | 38 | 3 |
| 2 | | | | | 0 | 0 | | | | 33 | | | | | 0 | 0 | 0 | | | | 9 | | | | 0 | 0 | | 6 | 36 | 26 |
| 3 | | | | | 4 | 0 | 26 | 15 | 7 | | 2 | | | | | | | 0 | 8 | | | 36 | | | | 0 | 12 | 25 | 10 | |
| 4 | | 27 | | 16 | 11 | | | 24 | | | | | | 37 | 4 | 8 | | | 6 | | 33 | | | 23 | | | 19 | 13 | 21 | |
| 5 | 37 | | 30 | | | | | 11 | | 23 | | | | | | 25 | 1 | | | 25 | | 20 | | | 16 | 12 | 15 | | | |
| 6 | | 26 | | | 35 | | 6 | 19 | | | | | | 25 | 27 | 20 | | | 38 | | 24 | | 37 | 29 | 4 | 2 | | | | |
| 7 | | | 27 | 3 | | | | 19 | 30 | 21 | | 13 | | 28 | | | 34 | 7 | | 31 | | | 37 | 14 | 38 | | | | | |
| 8 | | 7 | | | 34 | | | 26 | | 8 | 4 | | | | 16 | 6 | 36 | | | 9 | 27 | 19 | 33 | | | | | | | |
| 9 | 23 | | | 19 | 36 | 10 | 17 | | 18 | | | 3 | 31 | 30 | | | | 24 | 26 | 27 | 9 | | | | | | | | | |

| | 30 | 31 | 32 | 33 | 34 | 35 | 36 | 37 | 38 | 39 | 40 | 41 | 42 | 43 | 44 | 45 | 46 | 47 | 48 | 49 | |
|---|---|---|---|---|---|---|---|---|---|---|---|---|---|---|---|---|---|---|---|---|---|
| | 0 | 0 | | | | 0 | | 0 | 0 | 0 | 0 | 0 | 0 | | | | | | | | 0 |
| | | | 0 | | | | 0 | 37 | 39 | 23 | | 0 | 0 | | | | | | | | 1 |
| | | | | 0 | 0 | | | 21 | 30 | 15 | | | 0 | 0 | | | | | | | 2 |
| | | | 12 | | | 3 | | 11 | 18 | 16 | | | | 0 | 0 | | | | | | 3 |
| | 5 | | | 9 | | | | 35 | 28 | 34 | | | | | 0 | 0 | | | | | 4 |
| | 13 | | | | | 10 | | 24 | 38 | 2 | 39 | | | | | 0 | 0 | | | | 5 |
| | | 34 | | | | 11 | 33 | 12 | 5 | | | | | | | 0 | 0 | | | | 6 |
| | 15 | 32 | | | | 35 | 1 | 28 | | | | | | | | | 0 | 0 | | | 7 |
| | 17 | | | 22 | | 20 | 25 | 35 | | | | | | | | | | 0 | 0 | | 8 |
| | | | | 39 | | 4 | 22 | 34 | 7 | 1 | | | | | | | | | 1 | | 9 | wherein when the coding rate is 1/2 and the codeword length of the block LDPC code is $12N_s$, the second parity check matrix is generated by shortening a $0^{th}$ partial block column to a $29^{th}$ partial block column of the first parity check matrix using the shortening scheme, mapping partial matrices corresponding to a $30^{th}$ partial block column to a $39^{th}$ partial block column to the information word, and mapping partial matrices corresponding to a $40^{th}$ partial block column to a $49^{th}$ partial block column to the parity;

wherein when the coding rate is 2/3 and the codeword length of the block LDPC code is $30N_s$, the second parity check matrix is generated by shortening a $0^{th}$ partial block column to a $19^{th}$ partial block column of the first parity check matrix using the shortening scheme, mapping partial matrices corresponding to a $20^{th}$ partial where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

18. The method of claim 17, wherein when the coding rate is 1/3 and the codeword length of the block LDPC code is $15N_s$, the second parity check matrix is generated by shortening a $0^{th}$ partial block column to a $34^{th}$ partial block column of the first parity check matrix using the shortening scheme, mapping partial matrices corresponding to a $35^{th}$ partial block column to a $39^{th}$ partial block column to the information word, and mapping partial matrices corresponding to a $40^{th}$ partial block column to a $49^{th}$ partial block column to the parity;

wherein when the coding rate is 1/2 and the codeword length of the block LDPC code is $12N_s$, the second parity check matrix is generated by shortening a $0^{th}$ partial block column to a $29^{th}$ partial block column of the first parity check matrix using the shortening scheme, mapping partial matrices corresponding to a $30^{th}$ partial block column to a $39^{th}$ partial block column to the information word, and mapping partial matrices corresponding to a $40^{th}$ partial block column to a $49^{th}$ partial block column to the parity;

wherein when the coding rate is 2/3 and the codeword length of the block LDPC code is $30N_s$, the second parity check matrix is generated by shortening a $0^{th}$ partial block column to a $19^{th}$ partial block column of the first parity check matrix using the shortening scheme, mapping partial matrices corresponding to a $20^{th}$ partial block column to a $39^{th}$ partial block column to the information word, and mapping partial matrices corresponding to a $40^{th}$ partial block column to a $49^{th}$ partial block column to the parity;

wherein when the coding rate is 3/4 and the codeword length of the block LDPC code is $40N_s$, the second parity check matrix is generated by shortening a $0^{th}$ partial block column to a $9^{th}$ partial block column of the first parity check matrix using the shortening scheme, mapping partial matrices corresponding to a $10^{th}$ partial block column to a $39^{th}$ partial block column to the information word, and mapping partial matrices corresponding to a $40^{th}$ partial block column to a $49^{th}$ partial block column to the parity.

19. The method of claim 11, wherein when the coding rate is 2/3 and a codeword length of the block LDPC code is $48N_s$, the first parity check matrix is expressed as:

where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

20. The method of claim 19, wherein when the coding rate is 1/2 and the codeword length of the block LDPC code is $32N_s$, the second parity check matrix is generated by shortening a $0^{th}$ partial block column to a $15^{th}$ partial block column of the first parity check matrix using the shortening scheme, mapping partial matrices corresponding to a $16^{th}$ partial block column to a $31^{st}$ partial block column to the information word, and mapping partial matrices corresponding to a $32^{nd}$ partial block column to a $47^{th}$ partial block column to the parity.

21. The method of claim 11, wherein when the coding rate is 3/4 and a codeword length of the block LDPC code is $48N_s$, the first parity check matrix is expressed as:

22. The method of claim 21, wherein when the coding rate is 2/3 and the codeword length of the block LDPC code is $36N_s$, the second parity check matrix is generated by shortening a $0^{th}$ partial block column to a $11^{th}$ partial block column of the first parity check matrix using the shortening scheme, mapping partial matrices corresponding to a $12^{th}$ partial block column to a $35^{th}$ partial block column to the information word, and mapping partial matrices corresponding to a $36^{th}$ partial block column to a $47^{th}$ partial block column to the parity;

wherein when the coding rate is 1/2 and the codeword length of the block LDPC code is $24N_s$, the second parity check matrix is generated by shortening a $0^{th}$ partial block column to a $23^{rd}$ partial block column of the first parity check matrix using the shortening scheme, mapping partial matrices corresponding to a $24^{th}$ partial

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|----|----|----|----|----|----|----|----|----|----|----|----|----|----|
| 0 | 0 | 0 |   |   |   |   |   |   |   |   |    | 0  | 0  | 0  | 0  |    |    |    |    |    |    | 0  | 0  |    |
| 1 |   |   | 0 | 0 |   |   |   |   |   |   | 30 |    |    |    |    | 0  | 0  |    |    |    |    | 11 | 10 | 0  |
| 2 | 29|   |   |   | 0 | 0 |   |   |   |   | 31 |    |    |    |    |    |    | 0  | 0  | 0  |    | 30 | 28 | 34 |
| 3 |   |   | 37|   |   |   | 0 | 0 |   |   | 6  | 36 | 34 |    |    |    |    |    |    |    |    | 0  | 33 | 45 |
| 4 | 31|   |   |   |   |   |   |   | 0 | 0 | 39 |    |    |    | 38 | 43 |    |    | 25 |    |    | 10 | 18 |    |
| 5 |   |   | 27|   |   |   | 44|   |   |   | 4  | 18 |    | 7  |    |    |    | 32 |    |    |    | 27 | 2  |    |
| 6 | 42|   |   |   | 21|   |   |   |   |   | 33 | 28 |    |    |    |    | 46 | 3  |    |    |    | 31 | 0  | 9  |
| 7 |   |   | 8 | 19|   |   |   |   |   | 34| 15 | 23 | 34 |    |    | 2  |    |    |    |    |    | 16 |    | 3  |
| 8 | 22|   |   |   |   |   |   | 29|   |   | 40 | 33 |    |    | 11 |    |    |    |    |    | 20 | 6  | 3  | 1  |
| 9 |   |   |   |   | 46|   |   |   | 35|   | 20 | 42 | 29 |    |    |    | 15 |    |    |    |    | 47 | 10 | 39 |
| 10|   |   | 17|   |   |   | 18|   |   | 26| 37 | 36 |    |    |    |    | 14 | 7  |    |    |    | 34 | 1  |    |
| 11|   |   |   | 21| 0 |   |   | 40|   |   | 13 |    |    |    |    | 44 |    |    |    |    | 23 | 43 | 35 | 2  |

|   | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 |   |
|---|----|----|----|----|----|----|----|----|----|----|----|----|----|----|----|----|----|----|----|----|----|----|----|----|---|
| 0 | 0  | 0  |    |    |    |    |    |    | 0  | 0  | 3  | 1  | 0  |    |    |    |    |    |    |    |    |    |    |    | 0 |
| 1 |    |    | 0  | 0  | 0  |    |    |    | 37 |    | 24 |    | 0  | 0  |    |    |    |    |    |    |    |    |    |    | 1 |
| 2 |    |    |    |    | 0  | 0  |    |    | 38 |    | 3  |    |    |    | 0  | 0  |    |    |    |    |    |    |    |    | 2 |
| 3 |    |    |    |    |    |    | 0  | 0  | 43 | 8  | 16 |    |    |    | 0  | 0  |    |    |    |    |    |    |    |    | 3 |
| 4 | 20 | 29 |    |    |    |    |    |    | 45 | 24 | 38 |    |    |    |    |    | 0  | 0  |    |    |    |    |    |    | 4 |
| 5 |    |    | 2  |    |    | 9  |    |    | 46 | 21 | 20 |    |    |    |    |    | 0  | 0  |    |    |    |    |    |    | 5 |
| 6 | 25 |    | 12 |    |    |    |    |    | 38 | 46 |    | 0  |    |    |    |    |    |    | 0  | 0  |    |    |    |    | 6 |
| 7 |    |    |    |    | 28 | 37 |    |    | 37 | 29 | 15 |    |    |    |    |    |    |    | 0  | 0  |    |    |    |    | 7 |
| 8 |    |    | 30 |    |    |    | 19 |    |    | 0  | 4  |    |    |    |    |    |    |    |    |    | 0  | 0  |    |    | 8 |
| 9 |    | 21 | 32 |    | 2  |    |    |    | 43 |    | 19 |    |    |    |    |    |    |    |    |    | 0  | 0  |    |    | 9 |
| 10| 35 |    |    |    | 36 |    | 29 | 14 | 31 |    |    |    |    |    |    |    |    |    |    |    |    |    | 0  | 0  | 10|
| 11| 41 |    |    | 22 |    |    |    |    | 4  | 42 | 35 | 1  |    |    |    |    |    |    |    |    |    |    |    | 0  | 11| where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

block column to a $35^{th}$ partial block column to the information word, and mapping partial matrices corresponding to a $36^{th}$ partial block column to a $47^{th}$ partial block column to the parity.

23. The method of claim 11, wherein when the coding rate is 3/4 and a codeword length of the block LDPC code is $48N_s$, the first parity check matrix is expressed:

where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

24. The method of claim 23, wherein when the coding rate is 2/3 and the codeword length of the block LDPC code is $36N_s$, the second parity check matrix is generated by shortening a $0^{th}$ partial block column to a $11^{th}$ partial block column of the first parity check matrix using the shortening scheme, mapping partial matrices corresponding to a $12^{th}$ partial block column to a $35^{th}$ partial block column to the information word, and mapping partial matrices corresponding to a $36^{th}$ partial block column to a $47^{th}$ partial block column to the parity;

wherein when the coding rate is 1/2 and the codeword length of the block LDPC code is $24N_s$, the second parity check matrix is generated by shortening a $0^{th}$ partial block column to a $23^{rd}$ partial block column of the first parity check matrix using the shortening scheme, mapping partial matrices corresponding to a $24^{th}$ partial block column to a $35^{th}$ partial block column to the information word, and mapping partial matrices corresponding to a $36^{th}$ partial block column to a $47^{th}$ partial block column to the parity.

25. An apparatus for encoding a block Low Density Parity Check (LDPC) code having a variable coding rate, the apparatus comprising:

an encoder for coding an information word into a block LDPC code based on one of a first parity check matrix and a second parity check matrix depending on a coding rate to be applied when generating the information word into the block LDPC code;

a modulator for modulating the block LDPC code into a modulated symbol using a modulation scheme; and a transmitter for transmitting the modulated symbol;

wherein the encoder, comprises:

a controller for determining one of the first parity check matrix and the second parity check matrix according to the coding rate;

a first matrix multiplier for multiplying the information word by a first partial matrix of the determined parity check matrix;

a second matrix multiplier for multiplying the information word by a second partial matrix of the determined parity check matrix;

a third matrix multiplier for multiplying a sisznal output from the first matrix multiplier by a matrix multiplication of a third partial matrix and an inverse matrix of a fourth partial matrix of the determined parity check matrix;

a first adder for adding a signal output from the second matrix multiplier to a signal output from the third matrix multiplier;

a fourth matrix multiplier for multiplying a signal output from the first adder by a fifth partial matrix of the determined parity check matrix;

a second adder for adding the signal output from the second matrix multiplier to a signal outnut from the fourth matrix multiplier;

a fifth matrix multiplier for multiplying the signal output from the second adder by the inverse matrix of the fourth matrix of the determined parity check matrix; and a plurality of switches for multiplexing the information word, the output signal of the first adder, defined as a first parity word, and the output signal of the fifth matrix multiplier, defined as a second parity word, such that the information word, the first parity word and the second parity word are mappred to the block LDPC code, wherein each of the first parity check matrix and the second parity check matrix includes a plurality of partial blocks, the first parity check matrix includes an information part mapped to an information word and a parity part mapped to a parity word, a first number of partial blocks among the plurality of partial blocks in the first parity check matrix are mapped to the information part, and a second number of partial blocks, excluding the first number of partial blocks, among the plurality of partial blocks in the first parity check matrix are mapped to the parity part, and the second parity check matrix is obtained by shortening a predetermined number of partial blocks among the first number of partial blocks in the first parity check matrix.

26. The apparatus of claim 25, wherein a predetermined permutation matrix is mapped to each of predetermined partial blocks among the partial blocks on a one-to-one basis.

27. The apparatus of claim 25, wherein the first partial matrix and the second partial matrix are partial matrices mapped to an information part associated with an information word in the determined parity check matrix.

28. The apparatus of claim 27, wherein the third partial matrix and the fourth partial matrix are partial matrices mapped to a first parity part associated with a parity word, and the fifth partial matrix and the sixth partial matrix are partial matrices mapped to a second parity part associated with the parity word.

29. The apparatus of claim 28, wherein if the second parity check matrix is determined to be used according to the coding rate, the controller generates the second parity check matrix by applying one of a shortening scheme and a puncturing scheme to the first parity check matrix.

30. The apparatus of claim 29, wherein the second parity check matrix is obtained by shortening a number of partial blocks among the first number of partial blocks in the first parity check matrix using the shortening scheme.

31. The apparatus of claim 30, wherein when the coding rate is 3/7 and a codeword length of the block LDPC code is $49N_s$, the first parity check matrix is expressed as:

where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

32. The apparatus of claim 31, wherein when the coding rate is 1/3 and the codeword length of the block LDPC code is $42N_s$, the second parity check matrix is generated by shortening a $1^{st}$ partial block column to a $7^{th}$ partial block column of the first parity check matrix using the shortening scheme, mapping partial matrices corresponding to an $8^{th}$ partial block column to a $21^{st}$ partial block column to the information word, and mapping partial matrices corresponding to a $22^{nd}$ partial block column to a $49^{th}$ partial block column to the parity.

33. The apparatus of claim 32, wherein the first parity check matrix and the second parity check matrix are parity check matrices of which degree of distributions are optimized.

34. The apparatus of claim 30, wherein the second parity check matrix is obtained by puncturing a number of partial blocks among the second number of partial blocks in the first parity check matrix using the puncturing scheme.

35. The apparatus of claim 34, wherein when the coding rate is 3/7 and a codeword length of the block LDPC code is $49N_s$, the first parity check matrix is expressed:

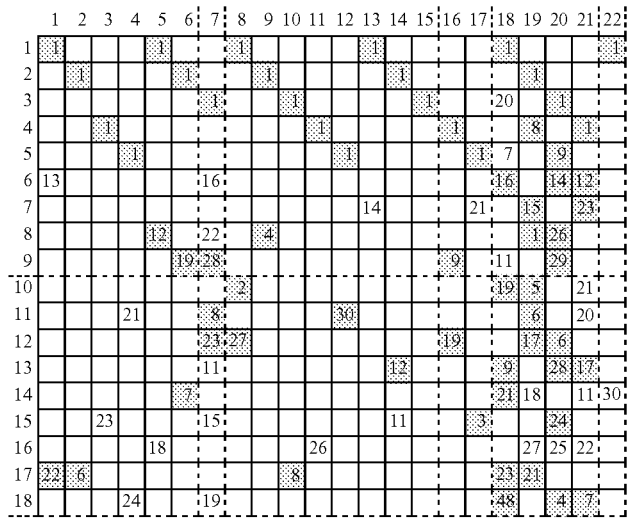
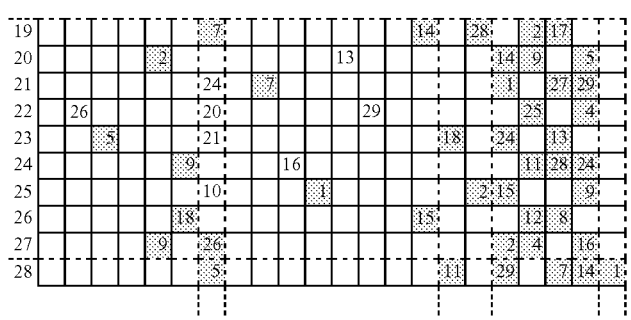
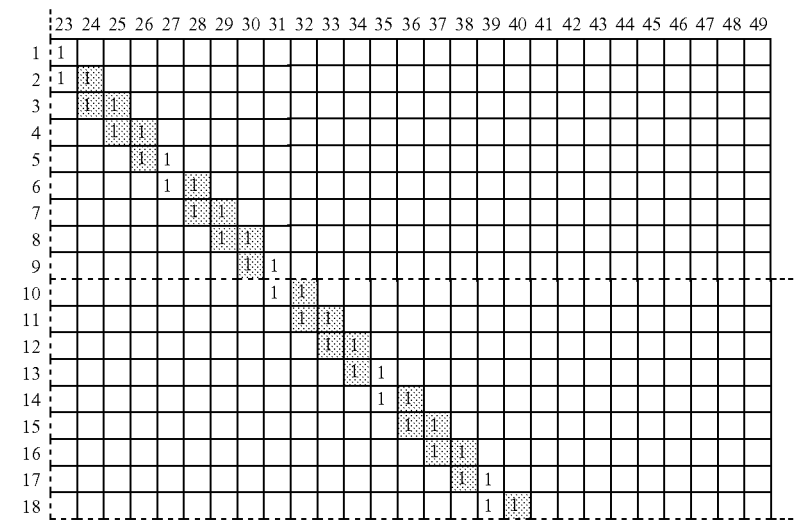

|    | 0 | 1 | 2 | 3 | 4 | 5 | 6 | 7 | 8 | 9 | 10 | 11 | 12 | 13 | 14 | 15 | 16 | 17 |
|----|---|---|---|---|---|---|---|---|---|---|----|----|----|----|----|----|----|----|
| 19 |   |   |   |   |   |   |   |   |   |   |    |    |    | 1  | 1  |    |    |    |
| 20 |   |   |   |   |   |   |   |   |   |   |    |    |    |    | 1  | 1  |    |    |
| 21 |   |   |   |   |   |   |   |   |   |   |    |    |    |    |    | 1  | 1  |    |
| 22 |   |   |   |   |   |   |   |   |   |   |    |    |    |    |    |    | 1  | 1  |
| 23 |   |   |   |   |   |   |   |   |   |   |    |    |    | 1  | 1  |    |    |    |
| 24 |   |   |   |   |   |   |   |   |   |   |    |    |    |    | 1  | 1  |    |    |
| 25 |   |   |   |   |   |   |   |   |   |   |    |    |    |    |    | 1  |    |    |
| 26 |   |   |   |   |   |   |   |   |   |   |    |    |    |    |    | 1  | 1  |    |
| 27 |   |   |   |   |   |   |   |   |   |   |    |    |    |    |    |    | 1  | 1  |
| 28 |   |   |   |   |   |   |   |   |   |   |    |    |    |    |    |    |    | 1  | where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

36. The apparatus of claim 35, wherein when the coding rate is 1/2 and the codeword length of the block LDPC code is $42N_s$, the second parity check matrix is generated by mapping partial matrices corresponding to a $1^{st}$ partial block column to a $21^{st}$ partial block column of the first parity check matrix, to the information word, and puncturing 7 predetermined partial block columns among a $22^{nd}$ partial block column to a $49^{th}$ partial block column using the puncturing scheme.

37. The apparatus of claim 36, wherein the first parity check matrix and the second parity check matrix are parity check matrices of which degree of distributions are optimized.

38. The apparatus of claim 37, wherein the punctured partial block columns include a $23^{rd}$ partial block column, a $27^{th}$ partial block column, a $31^{st}$ partial block column, a $35^{th}$ partial block column, a $39^{th}$ partial block column, a $43^{rd}$ partial block column, and a $47^{th}$ partial block column in the first parity check matrix.

39. The apparatus of claim 30, wherein when the coding rate is 4/5 and a codeword length of the block LDPC code is $50N_s$, the first parity check matrix is expressed as:

|   | 0  | 1  | 2  | 3  | 4  | 5 | 6  | 7  | 8  | 9  | 10 | 11 | 12 | 13 | 14 | 15 | 16 | 17 | 18 | 19 | 20 | 21 | 22 | 23 | 24 | 25 | 26 | 27 | 28 | 29 |
|---|----|----|----|----|----|---|----|----|----|----|----|----|----|----|----|----|----|----|----|----|----|----|----|----|----|----|----|----|----|----|
| 0 | 0  | 0  |    |    |    |   |    | 12 | 0  |    | 0  |    |    |    |    |    |    |    | 0  | 0  | 0  | 0  |    |    |    |    | 0  | 0  |    |    |
| 1 |    |    |    | 0  |    |   | 0  | 18 |    | 0  |    |    | 0  | 0  | 0  |    |    |    |    |    |    | 0  | 0  |    |    |    |    |    | 0  | 0  |
| 2 |    |    | 0  | 0  |    |   |    | 7  | 34 |    | 0  |    |    |    | 0  | 0  |    |    |    |    |    |    |    | 0  | 0  | 11 |    | 2  |    |    |
| 3 |    | 0  | 29 |    |    |   |    | 0  | 21 |    |    |    | 9  |    |    |    |    | 0  |    | 31 | 12 |    |    |    |    | 1  | 14 |    | 32 |    |
| 4 |    | 2  |    |    |    |   | 14 |    |    |    | 15 | 19 |    |    |    |    | 23 | 12 |    |    |    |    | 31 |    | 24 |    |    | 25 | 29 |    |
| 5 |    |    | 6  |    |    |   |    | 16 | 29 | 23 |    |    |    | 7  | 37 |    |    |    | 36 |    |    |    | 17 |    | 9  |    | 16 |    |    | 18 |
| 6 |    |    |    | 27 |    |   | 19 | 17 |    | 8  |    | 5  |    |    |    | 13 | 6  |    |    |    | 9  |    |    | 16 |    |    |    |    | 4  | 28 |
| 7 | 16 |    | 12 |    |    | 11 |   |    | 8  |    |    |    |    |    | 18 |    |    |    | 4  | 14 | 31 |    | 30 |    |    |    |    | 19 | 33 |    |
| 8 |    | 23 |    |    |    |   | 26 | 32 |    | 16 | 25 |    | 38 |    |    |    | 17 |    |    |    |    |    | 28 |    |    | 36 | 18 |    | 8  |    |
| 9 | 39 |    |    | 12 |    | 6 |    |    | 35 |    |    | 36 |    | 21 |    |    |    | 31 |    |    | 33 |    |    |    | 39 |    |    |    | 22 | 14 |

|   | 30 | 31 | 32 | 33 | 34 | 35 | 36 | 37 | 38 | 39 | 40 | 41 | 42 | 43 | 44 | 45 | 46 | 47 | 48 | 49 |   |
|---|----|----|----|----|----|----|----|----|----|----|----|----|----|----|----|----|----|----|----|----|---|
|   | 0  | 0  |    |    |    |    | 0  | 0  |    | 0  | 0  |    |    |    |    |    |    |    |    | 0  | 0 |
|   |    |    | 0  |    | 0  |    | 22 |    | 0  |    | 0  | 0  |    |    |    |    |    |    |    |    | 1 |
|   |    |    | 0  |    | 0  |    |    | 37 | 25 |    |    | 0  | 0  |    |    |    |    |    |    |    | 2 |
|   | 5  |    |    | 38 |    |    | 0  | 18 |    |    |    |    | 0  | 0  |    |    |    |    |    |    | 3 |
|   |    | 4  |    |    |    | 13 |    | 33 | 11 |    |    |    |    | 0  | 0  |    |    |    |    |    | 4 |
|   | 15 |    | 12 |    |    |    | 33 |    |    | 39 |    |    |    |    | 0  | 0  |    |    |    |    | 5 |
|   |    |    |    | 3  |    | 21 | 6  |    | 25 |    |    |    |    |    |    | 0  | 0  |    |    |    | 6 |
|   |    | 36 |    |    | 35 |    |    | 29 | 22 |    |    |    |    |    |    |    | 0  | 0  |    |    | 7 |
|   | 12 |    |    |    |    |    | 9  | 11 | 24 |    |    |    |    |    |    |    |    | 0  | 0  |    | 8 |
|   |    |    | 16 | 25 |    |    |    | 4  | 38 | 1  |    |    |    |    |    |    |    |    |    | 1  | 9 | where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

40. The apparatus of claim 39, wherein when the coding rate is 1/3 and the codeword length of the block LDPC code is $15N_s$, the second parity check matrix is generated by shortening a $0^{th}$ partial block column to a $34^{th}$ partial block column of the first parity check matrix using the shortening scheme, mapping partial matrices corresponding to a $35^{th}$ partial block column to a $39^{th}$ partial block column to the information word, and mapping partial matrices corresponding to a $40^{th}$ partial block column to a $49^{th}$ partial block column to the parity word;

block column to a $39^{th}$ partial block column to the information word, and mapping partial matrices corresponding to a $40^{th}$ partial block column to a $49^{th}$ partial block column to the parity word;

wherein when the coding rate is 3/4 and the codeword length of the block LDPC code is $40N_s$, the second parity check matrix is generated by shortening a $0^{th}$ partial block column to a $9^{th}$ partial block column of the first parity check matrix using the shortening scheme, mapping partial matrices corresponding to a $10^{th}$ partial block column to a $39^{th}$ partial block column to the information word, and mapping partial matrices corresponding to a $40^{th}$ partial block column to a $49^{th}$ partial block column to the parity word.

41. The apparatus of claim 30, wherein when the coding rate is 4/5 and a codeword length of the block LDPC code is $50N_s$, the first parity check matrix is expressed as:

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|----|----|----|----|----|----|----|----|----|----|----|----|----|----|----|----|----|----|----|----|
| 0 | 0 | 0 |   |   |   |   | 0 |   |   | 0 | 0  | 0  |    |    |    |    |    |    |    | 0  | 0  | 0  |    |    |    |    |    | 0  | 0  | 0  |
| 1 |   |   | 0 | 0 |   |   |   |   | 0 | 34|    |    | 0  | 0  | 0  |    |    |    |    |    | 5  |    |    | 0  | 0  |    |    | 12 | 38 | 3  |
| 2 |   |   |   |   | 0 | 0 |   |   |   | 33|    |    |    |    |    | 0  | 0  | 0  |    |    | 9  |    |    |    | 0  | 0  |    | 6  | 36 | 26 |
| 3 |   |   |   |   | 4 | 0 | 26| 15| 7 |   |    | 2  |    |    |    |    |    |    | 0  | 8  |    |    | 36 |    |    |    | 0  | 12 | 25 | 10 |
| 4 |   | 27|   | 16| 11|   |   |   |   | 24|    |    |    | 37 | 4  | 8  |    |    |    | 6  |    | 33 |    |    | 23 |    |    | 19 | 13 | 21 |
| 5 | 37|   | 30|   |   |   |   |   |   | 11|    | 23 |    |    |    |    |    | 25 |    | 1  |    |    |    | 25 |    | 20 |    | 16 | 12 | 15 |
| 6 |   | 26|   |   |   | 35|   | 6 |   | 19|    |    |    |    |    | 25 | 27 |    |    | 20 |    |    | 38 |    | 24 |    | 37 | 29 | 4  | 2  |
| 7 |   |   | 27| 3 |   |   |   |   | 19| 30|    | 21 |    | 13 |    | 28 |    |    |    | 34 | 7  |    |    | 31 |    |    | 37 | 14 | 38 |    |
| 8 |   | 7 |   |   |   |   | 34|   | 26|   |    | 8  |    | 4  |    |    | 16 | 6  |    | 36 |    |    |    |    | 9  |    | 27 | 19 | 33 |    |
| 9 | 23|   |   |   | 19|   |   | 36|   | 10| 17 |    |    | 18 |    |    |    | 3  |    | 31 | 30 |    |    |    | 24 | 26 | 27 |    | 9  |    |

|   | 30 | 31 | 32 | 33 | 34 | 35 | 36 | 37 | 38 | 39 | 40 | 41 | 42 | 43 | 44 | 45 | 46 | 47 | 48 | 49 |   |
|---|----|----|----|----|----|----|----|----|----|----|----|----|----|----|----|----|----|----|----|----|---|
| 0 | 0  | 0  |    |    | 0  |    | 0  | 0  | 0  | 0  | 0  | 0  |    |    |    |    |    |    |    |    | 0 |
| 1 |    | 0  |    |    |    |    | 0  | 37 | 39 | 23 | 0  | 0  |    |    |    |    |    |    |    |    | 1 |
| 2 |    |    | 0  | 0  |    |    | 21 | 30 | 15 |    |    | 0  | 0  |    |    |    |    |    |    |    | 2 |
| 3 |    |    | 12 |    |    | 3  | 11 | 18 | 16 |    |    |    | 0  | 0  |    |    |    |    |    |    | 3 |
| 4 |    | 5  |    | 9  |    |    | 35 | 28 | 34 |    |    |    |    | 0  | 0  |    |    |    |    |    | 4 |
| 5 | 13 |    |    |    |    | 10 | 24 | 38 | 2  | 39 |    |    |    |    | 0  | 0  |    |    |    |    | 5 |
| 6 |    |    |    |    | 34 |    | 11 | 33 | 12 | 5  |    |    |    |    |    | 0  | 0  |    |    |    | 6 |
| 7 |    | 15 | 32 |    |    |    | 35 | 1  | 28 |    |    |    |    |    |    |    | 0  | 0  |    |    | 7 |
| 8 | 17 |    |    | 22 |    |    | 20 | 25 | 35 |    |    |    |    |    |    |    |    | 0  | 0  |    | 8 |
| 9 |    |    |    |    | 39 |    |    | 4  | 22 | 34 | 7  | 1  |    |    |    |    |    |    |    | 1  | 9 | wherein when the coding rate is 1/2 and the codeword length of the block LDPC code is $12N_s$, the second parity check matrix is generated by shortening a 0th partial block column to a $29^{th}$ partial block column of the first parity check matrix using the shortening scheme, mapping partial matrices corresponding to a $30^{th}$ partial block column to a $39^{th}$ partial block column to the information word, and mapping partial matrices corresponding to a $40^{th}$ partial block column to a $49^{th}$ partial block column to the parity word;

wherein when the coding rate is 2/3 and the codeword length of the block LDPC code is $30N_s$, the second parity check matrix is generated by shortening a $0^{th}$ partial block column to a $19^{th}$ partial block column of the first parity check matrix using the shortening scheme, mapping partial matrices corresponding to a $20^{th}$ partial where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

42. The apparatus of claim 41, wherein when the coding rate is 1/3 and the codeword length of the block LDPC code is $15N_s$, the second parity check matrix is generated by shortening a $0^{th}$ partial block column to a $34^{th}$ partial block column of the first parity check matrix using the shortening scheme, mapping partial matrices corresponding to a $35^{th}$ partial block column to a $39^{th}$ partial block column to the information word, and mapping partial matrices corresponding to a $40^{th}$ partial block column to a $49^{th}$ partial block column to the parity word;

wherein when the coding rate is 1/2 and the codeword length of the block LDPC code is $12N_s$, the second parity check matrix is generated by shortening a $0^{th}$ partial block column to a $29^{th}$ partial block column of the first parity check matrix using the shortening scheme, mapping partial matrices corresponding to a $30^{th}$ partial block column to a $39^{th}$ partial block column to the information word, and mapping partial matrices corresponding to a $40^{th}$ partial block column to a $49^{th}$ partial block column to the parity word;

wherein when the coding rate is 2/3 and the codeword length of the block LDPC code is $30N_s$, the second parity check matrix is generated by shortening a $0^{th}$ partial block column to a $19^{th}$ partial block column of the first parity check matrix using the shortening scheme, mapping partial matrices corresponding to a $20^{th}$ partial block column to a $39^{th}$ partial block column to the information word, and mapping partial matrices corresponding to a $40^{th}$ partial block column to a $49^{th}$ partial block column to the parity word;

wherein when the coding rate is 3/4 and the codeword length of the block LDPC code is $40N_s$, the second parity check matrix is generated by shortening a $0^{th}$ partial block column to a $9^{th}$ partial block column of the first parity check matrix using the shortening scheme, mapping partial matrices corresponding to a $10^{th}$ partial block column to a $39^{th}$ partial block column to the information word, and mapping partial matrices corresponding to a $40^{th}$ partial block column to a $49^{th}$ partial block column to the parity word.

43. The apparatus of claim 30, wherein when the coding rate is 2/3 and a codeword length of the block LDPC code is $48N_s$, the first parity check matrix is expressed as:

where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

44. The apparatus of claim 43, wherein when the coding rate is 1/2 and the codeword length of the block LDPC code is $32N_s$, the second parity check matrix is generated by shortening a $0^{th}$ partial block column to a $15^{th}$ partial block column of the first parity check matrix shown in Table 12 using the shortening scheme, mapping partial matrices corresponding to a $16^{th}$ partial block column to a $31^{st}$ partial block column to the information word, and mapping partial matrices corresponding to a $32^{nd}$ partial block column to a $47^{th}$ partial block column to the parity word.

45. The apparatus of claim 30, wherein when the coding rate is 3/4 and a codeword length of the block LDPC code is $48N_s$, the first parity check matrix is expressed as:

46. The apparatus of claim 45, wherein when the coding rate is 2/3 and the codeword length of the block LDPC code is $36N_s$, the second parity check matrix is generated by shortening a $0^{th}$ partial block column to a $11^{th}$ partial block column of the first parity check matrix using the shortening scheme, mapping partial matrices corresponding to a $12^{th}$ partial block column to a $35^{th}$ partial block column to the information word, and mapping partial matrices corresponding to a $36^{th}$ partial block column to a $47^{th}$ partial block column to the parity word;

wherein when the coding rate is 1/2 and the codeword length of the block LDPC code is $24N_s$, the second parity check matrix is generated by shortening a $0^{th}$ partial block column to a $23^{rd}$ partial block column of the first parity check matrix using the shortening scheme, mapping partial matrices corresponding to a $24^{th}$ partial

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | 0 | | | | | | | | | 0 | 0 | 0 | 0 | 0 | | | | | | | 0 | 0 | |
| 1 | | 0 | 0 | | | | | | | | 30 | | | 0 | 0 | | | | | | | 11 | 10 | 0 |
| 2 | 29 | | 0 | 0 | | | | | | | 31 | | | | | | | 0 | 0 | 0 | | 30 | 28 | 34 |
| 3 | | 37 | | 0 | 0 | | | | | | 6 | 36 | 34 | | | | | | | | 0 | | 33 | 45 |
| 4 | 31 | | | | 0 | 0 | | | | | 39 | | | 38 | 43 | | | 25 | | | | 10 | | 18 |
| 5 | | 27 | | | | 44 | | | | | 4 | 18 | | 7 | | | | | | | 32 | | 27 | 2 |
| 6 | 42 | | | 21 | | | | | | | 33 | 28 | | | | | 46 | 3 | | | | 31 | 0 | 9 |
| 7 | | | 8 | 19 | | | | | | | 34 | 15 | 23 | 34 | | | 2 | | | | | 16 | | 3 |
| 8 | 22 | | | | | 29 | | | | | 40 | 33 | | | 11 | | | | | | 20 | 6 | 3 | 1 |
| 9 | | | | | 46 | | | 35 | | | 20 | 42 | | 29 | | | 15 | | | | | 47 | 10 | 39 |
| 10 | | | 17 | | | | 18 | | 26 | 37 | 36 | | | | | 14 | 7 | | | | | 34 | 1 | |
| 11 | | | | 21 | | 0 | | 40 | | | 13 | | | | 44 | | | | | | 23 | 43 | 35 | 2 |

| | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | |
|---|---|---|---|---|---|---|---|---|---|---|---|---|---|---|---|---|---|---|---|---|---|---|---|---|---|
| | 0 | 0 | | | | | | | 0 | 0 | 3 | 1 | 0 | | | | | | | | | | | | 0 |
| | | 0 | 0 | 0 | | | | | | 37 | 24 | | 0 | 0 | | | | | | | | | | | 1 |
| | | | 0 | 0 | | | | | | 38 | 3 | | | 0 | 0 | | | | | | | | | | 2 |
| | | | | 0 | 0 | | | | 43 | 8 | 16 | | | | 0 | 0 | | | | | | | | | 3 |
| | 20 | 29 | | | | | | | 45 | 24 | 38 | | | | | 0 | 0 | | | | | | | | 4 |
| | | | | | 2 | | 9 | | 46 | 21 | 20 | | | | | | 0 | 0 | | | | | | | 5 |
| | 25 | | | 12 | | | | | 38 | 46 | | 0 | | | | | | 0 | 0 | | | | | | 6 |
| | | | | | 28 | 37 | | | 37 | 29 | 15 | | | | | | | | 0 | 0 | | | | | 7 |
| | | | 30 | | | | 19 | | 0 | 4 | | | | | | | | | | 0 | 0 | | | | 8 |
| | | 21 | | 32 | | 2 | | | 43 | 19 | | | | | | | | | | | 0 | 0 | | | 9 |
| | 35 | | | | 36 | | 29 | 14 | 31 | | | | | | | | | | | | | 0 | 0 | | 10 |
| | 41 | | | 22 | | | | | 4 | 42 | 35 | 1 | | | | | | | | | | | | 0 | 11 | where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

block column to a $35^{th}$ partial block column to the information word, and mapping partial matrices corresponding to a $36^{th}$ partial block column to a $47^{th}$ partial block column to the parity word.

47. The apparatus of claim 30, wherein when the coding rate is 3/4 and a codeword length of the block LDPC code is $48N_s$, the first parity check matrix is expressed as:

where blocks represent the partial blocks, numbers represent exponents of corresponding permutation matrices, blocks with no number represent partial blocks to which zero matrices are mapped, I is an index representing an identity matrix for which an exponent of a corresponding permutation matrix is 0, and $N_s$ represents a size of the permutation matrix.

48. The apparatus of claim 47, wherein when the coding rate is 2/3 and the codeword length of the block LDPC code is $36N_s$, the second parity check matrix is generated by shortening a $0^{th}$ partial block column to a $11^{th}$ partial block column of the first parity check matrix using the shortening scheme, mapping partial matrices corresponding to a $12^{th}$ partial block column to a $35^{th}$ partial block column to the information word, and mapping partial matrices corresponding to a $36^{th}$ partial block column to a $47^{th}$ partial block column to the parity word;

wherein when the coding rate is 1/2 and the codeword length of the block LDPC code is $24N_s$, the second parity check matrix is generated by shortening a $0^{th}$ partial block column to a $23^{rd}$ partial block column of the first parity check matrix using the shortening scheme, mapping partial matrices corresponding to a $24^{th}$ partial block column to a $35^{th}$ partial block column to the information word, and mapping partial matrices corresponding to a $36^{th}$ partial block column to a $47^{th}$ partial block column to the parity word.

* * * * *

UNITED STATES PATENT AND TRADEMARK OFFICE
CERTIFICATE OF CORRECTION

PATENT NO. : 7,502,987 B2
APPLICATION NO. : 11/129183
DATED : March 10, 2009
INVENTOR(S) : Gyu-Bum Kyung et al.

Page 1 of 1

It is certified that error appears in the above-identified patent and that said Letters Patent is hereby corrected as shown below:

In the Specification

In column 21, line 26, "1627" should be --1827-- and "1629" should be --1829--.

In the Claims

In Claim 1, column 26, line 41, "and" should be deleted.

In Claim 1, column 26, line 60, "second" should be --first--.

In Claim 25, column 42, line 7, "encoder, comprises" should be --encoder comprises--.

In Claim 25, column 42, line 17, "sisznal" should be --signal--.

In Claim 25, column 42, line 29, "second" should be --first-- and "outnut" should be --output--.

In Claim 25, column 43, line 10, "mappred" should be --mapped--.

Signed and Sealed this
Tenth Day of December, 2013

Margaret A. Focarino
*Commissioner for Patents of the United States Patent and Trademark Office*